(12) United States Patent
Morampudi et al.

(10) Patent No.: US 12,199,050 B1
(45) Date of Patent: Jan. 14, 2025

(54) DEVICES BASED ON WAVE LOCALIZATION AND METHODS FOR THEIR USE

(71) Applicant: Software Defined Technologies, Inc., Carlsbad, CA (US)

(72) Inventors: Manichandra Morampudi, Cambridge, MA (US); Ravishankar Sundararaman, Cohoes, NY (US); Michael M. Salour, Carlsbad, CA (US)

(73) Assignee: Software Defined Technologies, Inc, Carlsbad, CA (US)

( * ) Notice: Subject to any disclaimer, the term of this patent is extended or adjusted under 35 U.S.C. 154(b) by 289 days.

(21) Appl. No.: 17/713,928

(22) Filed: Apr. 5, 2022

(51) Int. Cl.
*H05K 9/00* (2006.01)
*H01L 23/06* (2006.01)
*H01L 23/60* (2006.01)
*H01L 23/66* (2006.01)

(52) U.S. Cl.
CPC ............. *H01L 23/60* (2013.01); *H01L 23/06* (2013.01); *H01L 23/66* (2013.01); *H05K 9/0083* (2013.01)

(58) Field of Classification Search
CPC .................................................. H05K 9/0083
See application file for complete search history.

(56) References Cited

U.S. PATENT DOCUMENTS

| | | | |
|---|---|---|---|
| 6,379,589 B1 * | 4/2002 | Aldissi | B22F 1/18 148/108 |
| 9,408,336 B1 | 8/2016 | Zang | |
| 9,545,043 B1 * | 1/2017 | Hamilton | H01L 23/295 |
| 10,219,418 B2 | 2/2019 | Zang | |
| 11,026,358 B2 | 6/2021 | Zang et al. | |
| 2006/0241236 A1 * | 10/2006 | Kuznetsov | C09D 133/12 977/734 |

(Continued)

OTHER PUBLICATIONS

Yongge Wang, On the Design of LIL Tests for (Pseudo) Random Generators and Some Experimental Results, arXiv: 1401.3307 [cs.CR], Jan. 2014.

(Continued)

*Primary Examiner* — Hung V Ngo
(74) *Attorney, Agent, or Firm* — CMLaw PLLC; Orlando Lopez

(57) ABSTRACT

An electromagnetically shielded or reflecting device having a film of shielding or reflecting material and a device for obtaining, in a dielectric material volume, selective propagation of electromagnetic radiation in predetermined frequency band. The shielding or reflecting material includes a polymer, and electrically conducting particles substantially randomly dispersed in the polymer The film is used in shielding objects against electromagnetic radiation across a range of frequencies, The device for obtaining, in a dielectric material volume, selective propagation of electromagnetic radiation in predetermined frequency band includes a dielectric material volume extending from a first surface to a second surface, a first number of cavities, a second number of cavities, each cavity from the first and second numbers extending from the first surface to the second surface, the cavities being substantially randomly distributes on the first or second surface and being filed with an electrically conducting material.

29 Claims, 19 Drawing Sheets

(56) References Cited

U.S. PATENT DOCUMENTS

| | | | | |
|---|---|---|---|---|
| 2009/0101873 | A1* | 4/2009 | Tan | H05K 9/0083 |
| | | | | 252/500 |
| 2016/0264762 | A1* | 9/2016 | Al-Ghamdi | C08K 7/00 |
| 2020/0276797 | A1* | 9/2020 | Zdrojek | C08K 3/042 |
| 2021/0400855 | A1 | 12/2021 | Zang | |

OTHER PUBLICATIONS

Chung-Kwong Yuen, Testing Random Number Generators by Walsh Transform, IEEE Transactions on Computers, vol. C-26, No. 4, Apr. 1977.

Frank A. Feldman, A New Spectral Test for Nonrandomness and the DES, IEEE Transactions on Software Engineering. vol. 16. No. 3, Mar. 1990.

S.E. Skipetrov, I.M. Sokolov, Ioffe-Regel criterion of Anderson localization in the model of resonant point scatterers, Phys. Rev. B 98, 064207 (Aug. 2018).

Generate Random No. inside a closed area—(mathworks.com) accessed on Dec. 30, 2021.

https://mathworld.wolfram.com/LinePointPicking.html accessed Dec. 21, 2021.

RandomPoint-Wolfram Language Documentation accessed on Dec. 30, 2021.

J. Philip, "The Probability Distribution of the Distance between Two Random Points in a Box," Technical Report No. TRITA MAT 07 MA 10, 1991.

George Marsaglia , B. Narasimhan & Arif Zaman (1990) The distance between random points in rectangles, Communications in Statistics—Theory and Methods, 19:11, 4199-4212.

\* cited by examiner

310 obtaining, for a second surface of the of the dielectric material volume, the dielectric material volume extending from a first surface to a second surface, a distribution of the first plurality of cross-sectional areas distributed throughout a first sub-area and a distribution of a second plurality of cross-sectional areas distributed throughout a second sub-area

320 forming a mask, having openings at each cross-sectional area, to be disposed on the second surface

330 disposing the mask on the second surface

340 removing, from the second surface to the first surface, material of the of the dielectric material volume under each opening Fig, 14A

14B

DEVICES BASED ON WAVE LOCALIZATION AND METHODS FOR THEIR USE

BACKGROUND

These teachings relate generally to devices based on wave localization and methods for their use. Uses include electromagnetic shielding materials, electromagnetic shielding materials, and materials with selective propagation of electromagnetic radiation in predetermined frequency bands.

Electromagnetic shielding needs are found in a number of diverse applications, from electronic components and computing components to large systems. Reflective materials find use in a number of applications. Materials with selective propagation of electromagnetic radiation in predetermined frequency bands have generated interest for a number of uses.

Present materials to shield against electromagnetic radiation lack sufficient electromagnetic shielding efficacy, a large frequency range of operation, structural flexibility, desired thermal properties, and/or electrical insulation. For example, polymer composites primarily absorb electromagnetic radiation leading to heating—an undesirable trait when in close proximity to electronics. Further, polymer composites do not achieve the same shielding efficacy as metal enclosures, and do not function over a wide frequency range. Also, metal enclosures do not have the structural flexibility of polymer composites and cannot shield against interference generated within the enclosure.

The guiding of radiation in a two-dimensional substrate such as silicon is a critical operation for the operation of nanophotonic devices. Photonic crystals are composed of periodic dielectric, metallo-dielectric microstructures or nanostructures that affect electromagnetic wave propagation in the same way that the periodic potential in a semiconductor crystal affects the propagation of electrons, determining allowed and forbidden electronic energy bands. Disallowed bands of wavelengths are called photonic band gaps. Present methods to guide radiation in nanophotonics devices exploit photonic band gaps created using a regular patterned grid in a substrate In one instance, when a regular pattern of holes (of shapes such as circles, rectangles etc) is created in a substrate, using various lithography methods, wave interference effects create what is known as a photonic band gap. The holes are generally left unfilled, i.e., it simply contains air. A regular pattern of holes (of shapes such as circles, rectangles etc) is created in a substrate, using various lithography methods, wave interference effects create what is known as a photonic band gap. A photonic band gap is a frequency range between which there is no propagation of electromagnetic radiation through the nanopatterned substrate.

The introduction of a waveguide, i.e., a region in which the regular pattern is absent, then allows for a guided propagation of modes in the band gap. A photonic band gap created using a regular lithographic pattern of holes can only prevent propagation in a certain frequency band. The device fails to confine radiation to within the waveguide for frequencies outside the photonic band gap, i.e., the device can no longer serve as a waveguide.

There is a need for more effective electromagnetic shielding materials.

There is a further need for more effective electromagnetic shielding material that scatters incoming radiation.

There is also a need for approaches that provide a larger range of frequencies where the radiation can be guided.

There is a further need for more effective electromagnetic shielding material that scatters incoming radiation.

BRIEF SUMMARY

The material formulation of these teachings includes a polymer solution and electrically conducting particles substantially randomly dispersed in the polymer solution. A concentration of the electrically conducting particles dispersed in the polymer solution exceeds a predetermined concentration. Each characteristic dimension of each one of the electrically conducting particles is larger than a predetermined dimensional quantity.

The polymer composite of these teachings, including a substantially random arrangement of electrically conducting particles suspended in a polymer solution, a suspension of the electrically conducting particles having a weight fraction that exceeds a predetermined threshold, primarily reflects all incident electromagnetic radiation instead of absorbing it. The shielding efficacy is greater than that achieved by prior polymer-based materials and is close to the efficacy offered by metal shielding. The present teachings combine the flexibility of polymer composite EMI materials with the shielding efficacy of metal enclosures. Further, the present teachings work across a very large frequency range—from kilohertz to terahertz.

In one or more instances, an electromagnetically shielded device of these teachings has an object to be shielded; and a shielding material disposed on at least of a portion of at least one surface of the object, the shielding material comprising a first layer comprising a polymer, and electrically conducting particles substantially randomly dispersed in the polymer. A concentration of the electrically conducting particles dispersed in the polymer exceeds a predetermined concentration. Each characteristic dimension of each one of the electrically conducting particles is larger than a predetermined dimensional quantity.

In one or more instances, a reflecting device of these teachings includes a substrate or object, and a reflecting material disposed on at least of a portion of a surface of the substrate or object. The reflecting material includes a polymer dissolved in organic solvents, and electrically conducting particles substantially randomly dispersed in the polymer. A concentration of the electrically conducting particles dispersed in the polymer exceeds a predetermined concentration. Each characteristic dimension of each one of the electrically conducting particles is larger than a predetermined dimensional quantity.

In one or more instances, a method of these teachings for making shielding or reflective material includes forming a polymer-organic solvent solution by dissolving a polymer in an organic solvent, embedding electrically conducting particles in the polymer-organic solvent solution in a substantially random distribution by dispersing the electrically conducting particles in the polymer-organic solvent solution. A percent weight of the electrically conducting particles dispersed in the polymer-organic solvent solution exceeds a predetermined percent weight. Each characteristic dimension of each one of the electrically conducting particles is larger than a predetermined dimensional quantity.

In one or more instances, the device of these teachings for obtaining, in a dielectric material volume, selective propagation of electromagnetic radiation in predetermined frequency band includes a dielectric material volume extending from a first surface to a second surface, a first number of cavities, a second number of cavities, each cavity from the first and second numbers extending from the first surface to the second surface, the first number of cavities being located in a first sub-volume of the dielectric material volume, the second number of cavities being located in a second sub-volume of the dielectric material volume, the first sub-volume and the second sub-volume being separated by a channel volume. The first number of cavities is distributed throughout the first sub-volume in a substantially random pattern. The second number of cavities is distributed throughout the second sub-volume in another substantially random pattern. Each cavity from the first and second numbers of cavity is substantially filled with an electrically conducting material. A concentration of the first number of cavities distributed throughout the first sub-volume. The concentration of the first number of cavities exceeds a predetermined concentration. A concentration of the second number of cavities distributed throughout the second sub-volume. The concentration of the second number of cavities exceeds the predetermined concentration. A characteristic dimension of each cavity from the first and second numbers of cavities is larger than a predetermined dimensional quantity.

In one or more instances, the method of these teachings for obtaining, in a dielectric material volume, selective propagation of electromagnetic radiation in predetermined frequency bands includes obtaining, for a second surface of the of the dielectric material volume, the dielectric material volume extending from a first surface to a second surface, a distribution of the first number of cross-sectional areas distributed throughout a first sub-area, a concentration of the first number of cross-sectional areas exceeding a predetermined concentration, and a distribution of a second number of cross-sectional areas distributed throughout a second sub-area, a concentration of the second number of cross-sectional areas exceeding a predetermined concentration. The first sub-area and the second sub-area are separated by a channel area, The second surface includes the first sub-area, the second sub-area and the channel area. The first number of cross-sectional areas is distributed throughout the first sub-area in a substantially random pattern. The second number of cross-sectional areas being distributed throughout the second sub-area in another substantially random pattern. A characteristic dimension of each cross-sectional area from the first and second numbers of cross-sectional areas is larger than a predetermined dimensional quantity. The method also includes forming a mask, to be disposed on the second surface; the mask having an opening at each cross-sectional area from the first and second numbers of cross-sectional areas, disposing the mask on the second surface of the dielectric material volume, removing, from the second surface to the first surface, material of the of the dielectric material volume under the opening at each cross-sectional area from the first and second numbers of cross-sectional areas, thereby forming cavities from the second surface to the first surface, an cavity at the opening at each cross-sectional area from the first and second numbers of cross-sectional areas, deposit electrically conducting material into each cavity, substantially filling each cavity with the electrically conducting material, and removing the mask.

For a better understanding of the present teachings, together with other and further objects thereof, reference is made to the accompanying drawings and detailed description and its scope will be pointed out in the appended claims.

BRIEF DESCRIPTION OF THE DRAWINGS

FIGS. 14A and 14B depict a flowchart representation of the method of these teachings for obtaining, in a dielectric material volume, selective propagation of electromagnetic radiation in predetermined frequency band.

DETAILED DESCRIPTION

The following detailed description presents the currently contemplated modes of carrying out the present teachings.

The description is not to be taken in a limiting sense but is made merely for the purpose of illustrating the general principles of the teachings, since the scope of the teachings is best defined by the appended claims.

The material formulation of these teachings includes a polymer solution and electrically conducting particles substantially randomly dispersed in the polymer solution. A concentration of the electrically conducting particles dispersed in the polymer solution exceeds a predetermined concentration. Each characteristic dimension of each one of the electrically conducting particles is larger than a predetermined dimensional quantity.

In one instance, the electromagnetically shielded device of these teachings includes an object to be shielded, and a shielding material of these teachings disposed on at least of a portion of at least one surface of the object. The shielding material of these teachings, in that instance, includes a first layer comprising a polymer dissolved in organic solvents, and electrically conducting particles substantially randomly dispersed in the polymer solution. A concentration of the electrically conducting particles dispersed in the polymer solution exceeds a predetermined concentration. Each characteristic dimension of each one of the electrically conducting particles is larger than a predetermined dimensional quantity.

"Substantially randomly dispersed,' as used herein, refers to being dispersed substantially without a pattern. Substantially is used herein since a micropattern can be detected but, if that pattern does not repeat over the entire group of particles, any of the measures of randomness will provide a result that indicates randomness. (For measures of randomness, see, for example, Yongge Wang, On the Design of LIL Tests for (Pseudo) Random Generators and Some Experimental Results, arXiv: 1401.3307 [cs.CR], January 2014, or CHUNG-KWONG YUEN, Testing Random Number Generators by Walsh Transform, IEEE TRANSACTIONS ON COMPUTERS, VOL. C-26, NO. 4, APRIL 1977, or FRANK A FELDMAN, A New Spectral Test for Nonrandomness and the DES, IEEE TRANSACTIONS ON SOFTWARE ENGINEERING. VOL. 16. NO. 3, MARCH 1990, all of which are incorporated by reference herein in their entirety and for all purposes).

"Cross-sectional area," as used herein, refers to the area produced by the intersection of a plane perpendicular to the center axis of a cavity, extending from a first plane surface to a second plane surface, with the cavity structure. If the cavity is a circular cylinder, the cross-sectional area is the area of a circle.

Figure 1:
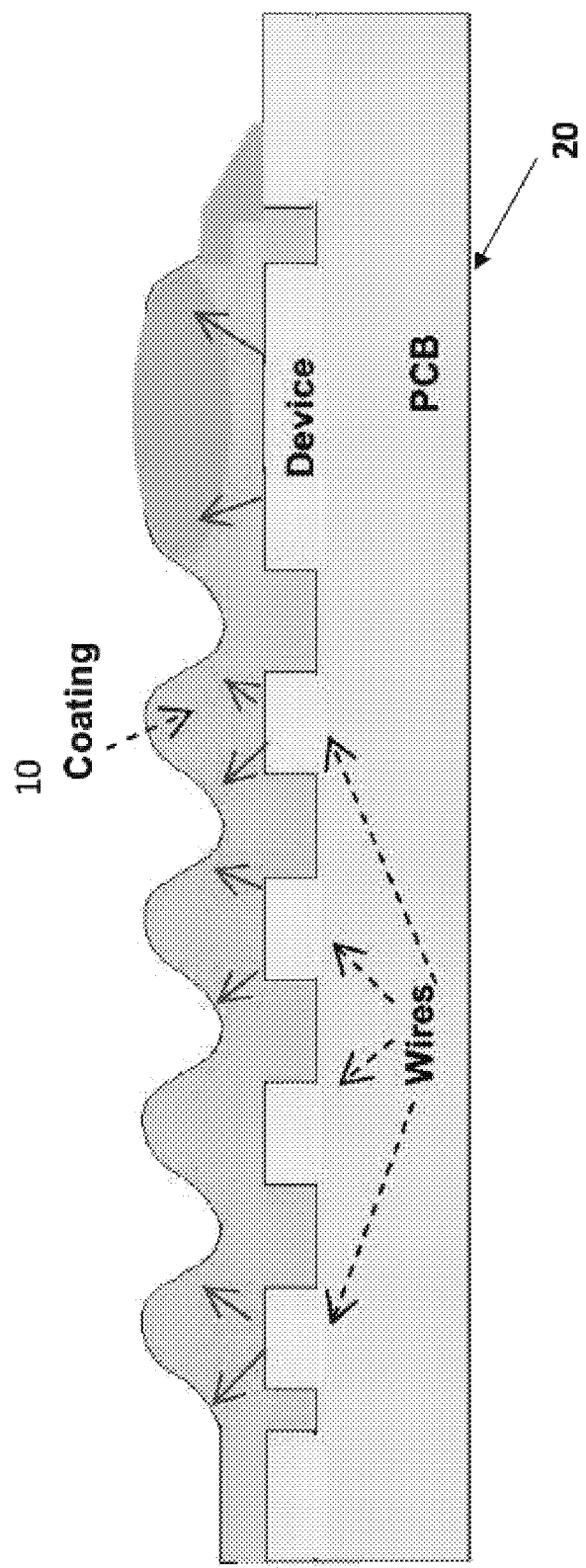
FIG. 1 shows an instantiation of an electromagnetically shielded device of these teachings.
Figure 2A:
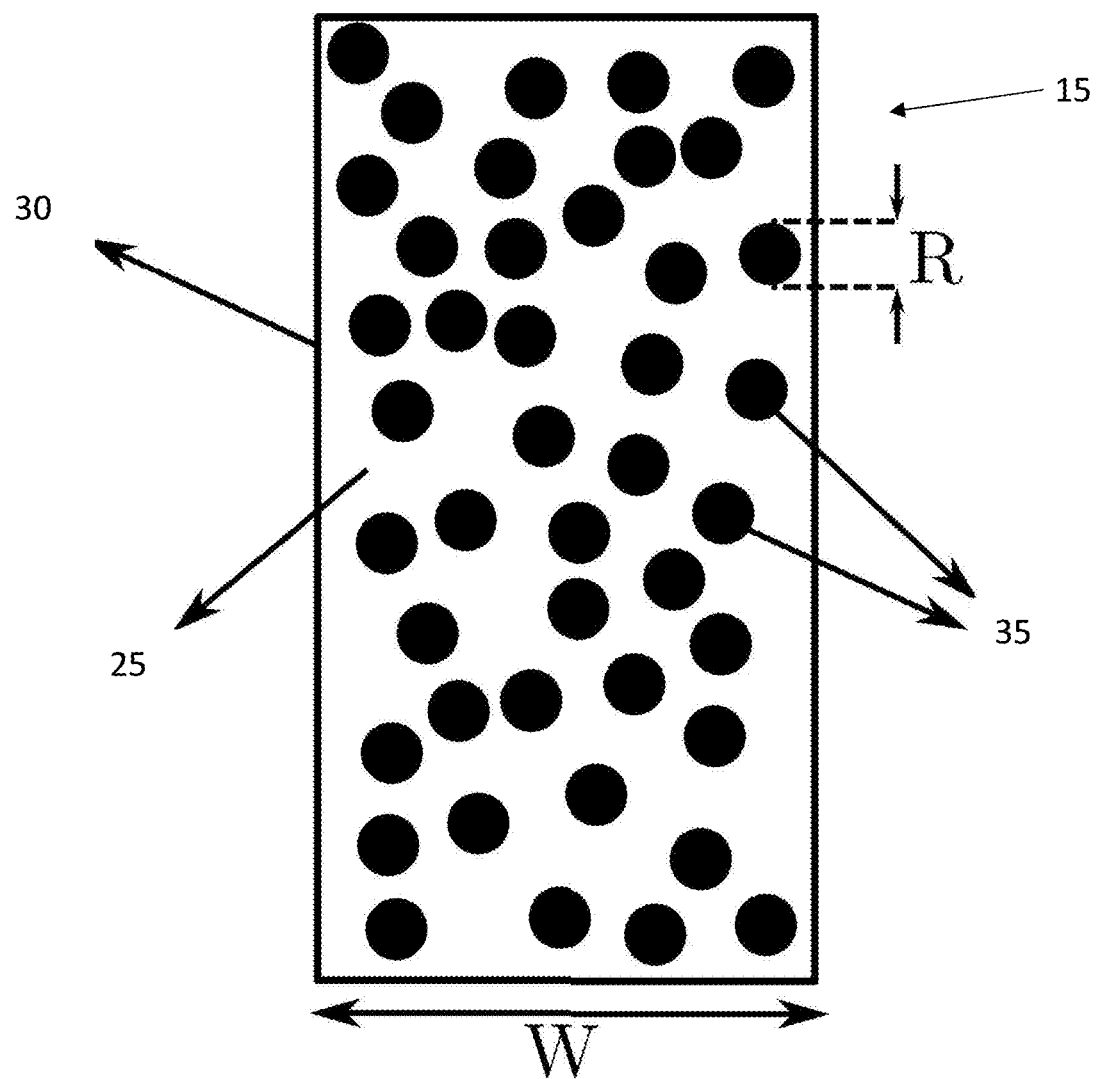
FIG. 2A shows an instantiation of a shielding or reflecting material of these teachings.

FIG. 1 shows one instance of an electromagnetically shielded device, in which an object to be shielded 20 has a shielding material 10 disposed on at least one portion of one surface of the object. It should be noted that other instances of electromagnetically shielded devices are also within the scope of these teachings. FIG. 2A shows an instantiation in which the shielding material 10 (FIG. 1) includes a layer 15 of a polymer-electrically conducting nanoparticle composite 25 (also referred to as a first layer) including a polymer 25 in which electrically conducting particles 35 are substantially randomly dispersed. A width W of the layer 15 can range, in one instance, from a few microns to several hundred microns. The electrically conducting particles have an average characteristic dimension R (such as, for example, a radius in substantially spherical particles) that can range, in an instances, from sub microns to a few microns. (Although the particles are often referred to as nanoparticles, particles in the previously defined range and other vendors are within the scope of these teachings.) One surface of the layer would be disposed on the portion of the surface of an object to be shielded and an order surface of the layer, 30, receives the incoming electromagnetic radiation.

Figure 2B:
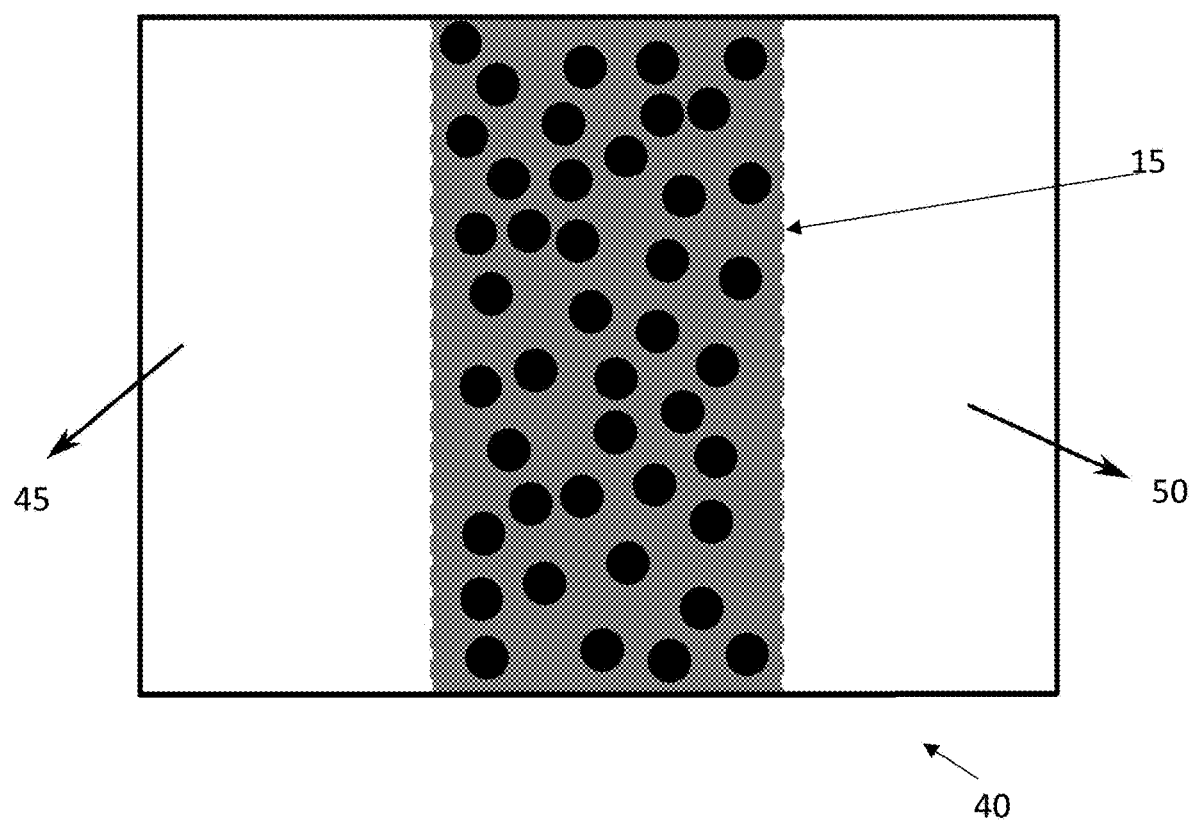
FIG. 2B shows another instantiation of a shielding or reflecting material of these teachings.
Figure 2C:
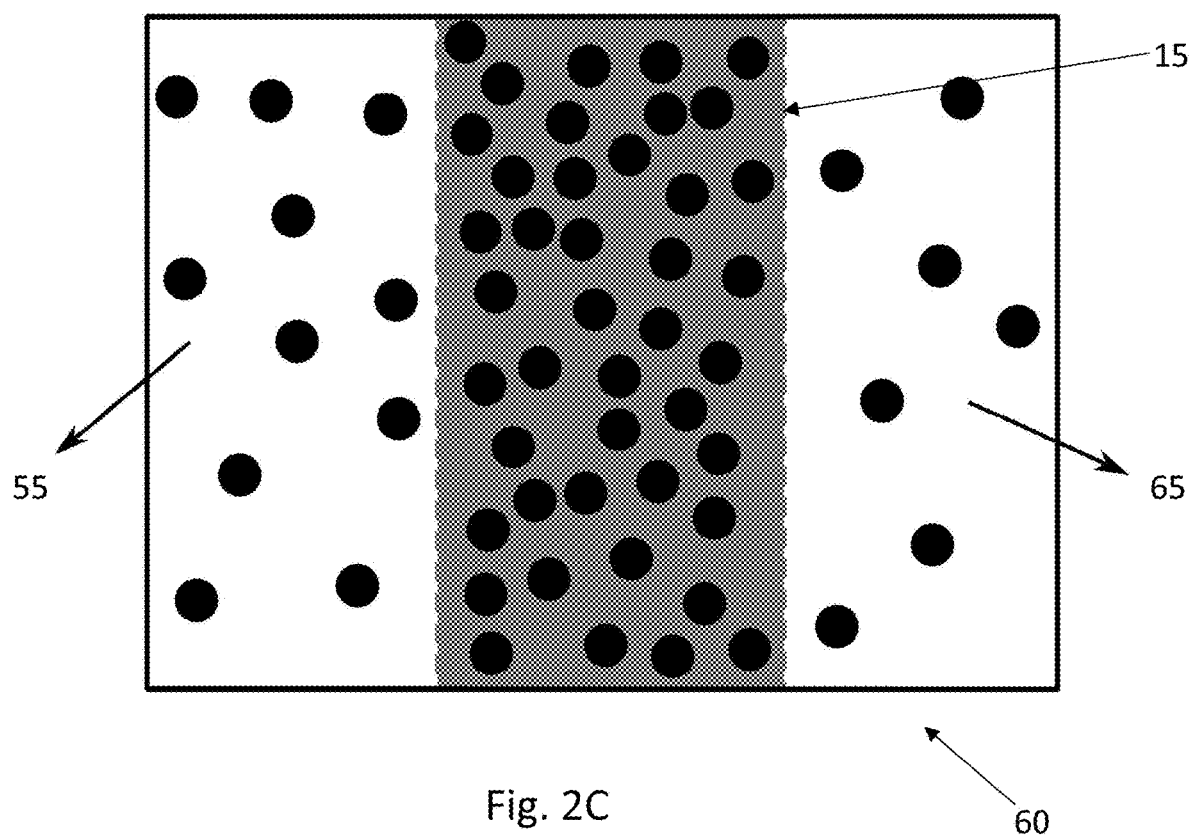
FIG. 2C shows yet another instantiation of a shielding or reflecting material of these teachings.

In another instance 40, shown in FIG. 2B, the shielding material 10 (FIG. 1) includes the first layer 15 (shown in FIG. 2A) and up to two polymer layers 45, 50. These teachings include the instances when there is only one polymer layer (45 or 50) and instances whether the shielding material includes two polymer layers 45, 50. FIG. 2C shows a further instance 60 in which the shielding material 10 (FIG. 1) includes the first layer 15 (shown in FIG. 2A) and up to two other layers 55, 65, where nanoparticles are dispersed in each of the other layers 55, 65. Instances in which the shielding material includes combinations of FIGS. 2A and 2C are also within the scope of these teachings.

Figure 3:
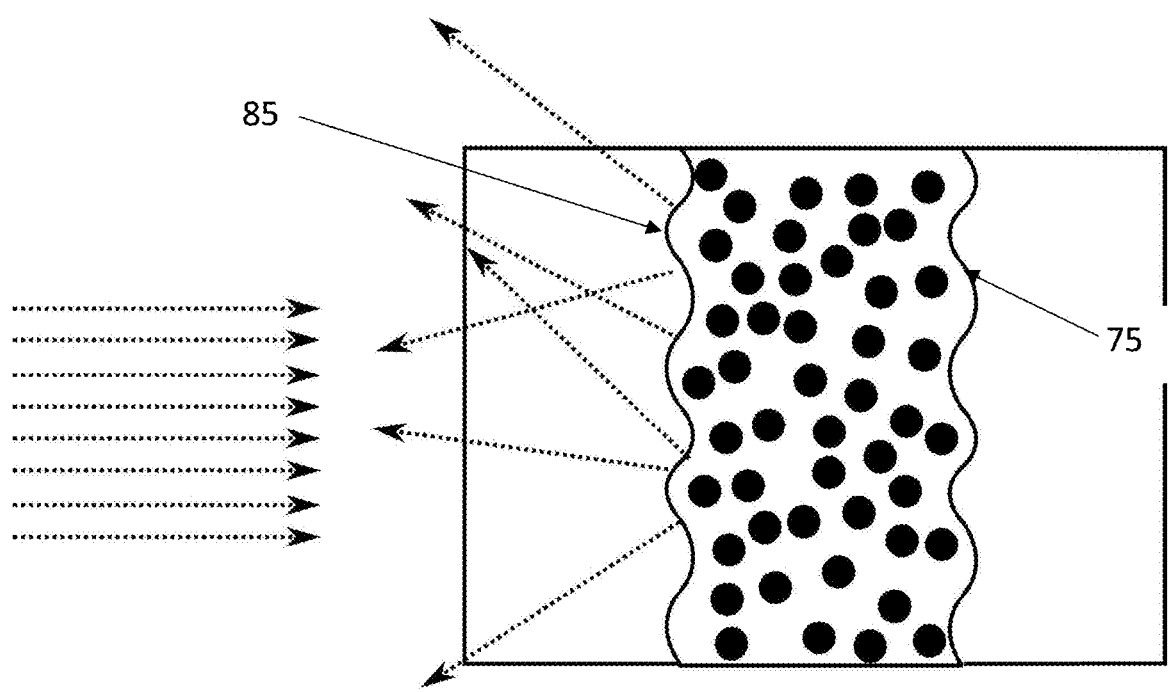
FIG. 3 shows a further instantiation of a shielding or reflecting material of these teachings.

In a further instance, shown in FIG. 3, at least one surface of the shielding material 10 (FIG. 1) is either a shaped surface or an undulated surface or a corrugated surface. In the instance shown in FIG. 3, the shielding material it is in the configuration shown in FIG. 2A and both surfaces 75, 85 are form in given shapes. It should be noted that other configurations, for example the ones shown in FIGS. 2B and 2C, in which at least one of the surfaces is a shaped surface, are also within the scope of these teachings. In one instance, the polymer is dissolved in organic solvents at one point in the process of forming the polymer-particle composite. Organic solvents used include, but are not limited to, of butanol, ethanol, methanol, a chloroform/alcohol blend and ionic solvents.

The electrically conducting particles used in these teachings include metal particles and can also include carbon nanotubes and other electrically conducting materials. The polymer used in these teachings includes, but is not limited to, Poly-THF melts, polyamides, such as polyamide 6, polyamide 8 and polyamide 11, polyester, PET, polystyrene, polydivinylbenzene, polymethyl methacrylate, polyisoprene, Polyvinyl acetate polyethylene. and biopolymers. In one instance, the biopolymer includes at least one of a DNA-lipid based complex or an RNA-lipid based complex, such as the DNA-lipid based and RNA-lipid complexes disclosed in U.S. Pat. Nos. 9,408,336, 10,219,418, 11,026,358, and U.S. Patent Application Publication No. 2021/0400855, corresponding to U.S. patent application Ser. No. 17/334,113, all of which are incorporated by reference herein in their entirety and for all purposes.

Figure 4:
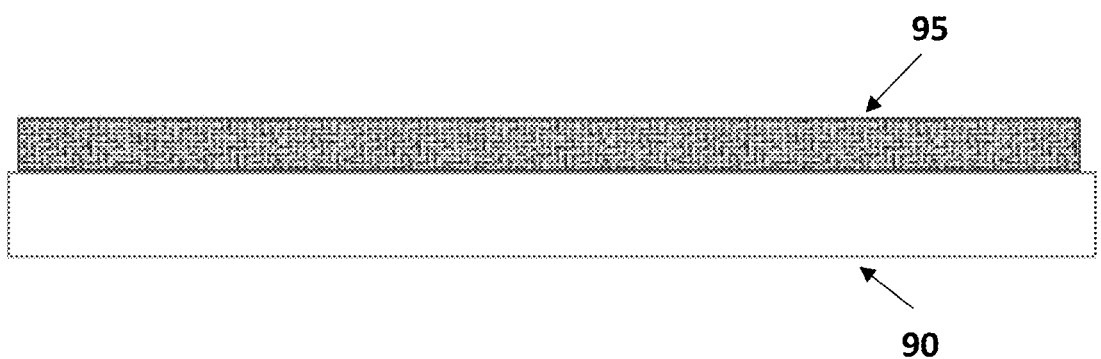
FIG. 4 shows an instantiation of an electromagnetically reflecting device of these teachings.

In another configuration, the device of these teachings is a reflecting device. In one instance, the reflecting device of these teachings includes a substrate or object and a reflecting material disposed on at least a portion of a surface of the substrate or the object. The reflecting material comprising a polymer, dissolved in organic solvent, and electrically conducting particles substantially randomly dispersed in the polymer. A concentration of the electrically conducting particles dispersed in the polymer exceeding a predetermined concentration. Each characteristic dimension of each one of the electrically conducting particles being larger than a predetermined dimensional quantity. FIG. 4 shows an instantiation of an electromagnetically reflecting device of these teachings; In the instantiation shown in FIG. 4, a film 95 of the reflecting material is deposited on the substrate 90.

A reflecting device, as used herein, is a device that receives electromagnetic radiation, incident on the device in one direction, and outputs electromagnetic radiation having one component in the opposite direction of the electromagnetic radiation incident on the device.

A reflecting material, as used here in, is a material that receives electromagnetic radiation, incident on the material in one direction, and outputs electromagnetic radiation having one component in the opposite direction, opposite to the direction of the electromagnetic radiation incident on the material.

All of the above described characteristics for the shielding material of these teachings apply to the reflecting material of these teachings. In one instance, the substrate or object used is flexible.

In one instance, the predetermined concentration of the substantially randomly dispersed electrically conducting particles is related to the mean free path of photons in the medium with the substantially randomly dispersed electrically conducting particles and the effective wavelength of the incident radiation. While not desiring to be bound by theory, when the mean free path of photons in the medium becomes of the order of a shorter than the wavelength, different regimes of wave transport can occur. One predetermined concentration is the predetermined concentration obtained by requiring that the product of wave number (k=2π/wavelength) for the effective wavelength and the effective mean free path $1$ be less than or equal to 1. Since the electrically conducting particles are randomly dispersed, one option for the effective mean free path is the average distance between particles. In a band of wavelengths in the incident electromagnetic radiation, one can select the shortest wavelength in a finite band (or, in a continuum of wavelengths, the shortest wavelength in the effective bandwidth). (A more complicated prescription is provided by S. E. Skipetrov, I. M. Sokolov, Ioffe-Regel criterion of Anderson localization in the model of resonant point scatterers, Phys. Rev. B 98, 064207 (August 2018), which is incorporated by reference herein in its entirety and for all purposes.) Once the desired concentration is arrived at, it can be easily converted to percent weight.

One instantiation of the predetermined dimensional quantity is one or a multiple of the skin depth at a characteristic frequency, the depth at which the field drops to 1/e of the incident value, which is given by $$\delta = \frac{1}{\sqrt{\pi f \mu \sigma}},$$

where f is frequency, p is the magnetic permeability of the electrically conducting particles material, which equals $\mu_0 \mu_r$ ($\mu_0 = 1.26 \cdot 10^{-6}$ H/m and $\mu_r$ is the relative magnetic permeability of the material compared with that of copper, which is 1), and a is the electrical conductivity in $\Omega^{-1} m^{-1}$ for the electrically conducting particles material. If a band of frequencies is being considered, the lowest value should be used to obtain the larger skin depth (or, in a continuum of frequencies, the lowest value of frequency in the effective bandwidth). At four skin depths, the incident field is attenuated by about 32 DB.

Figure 5:
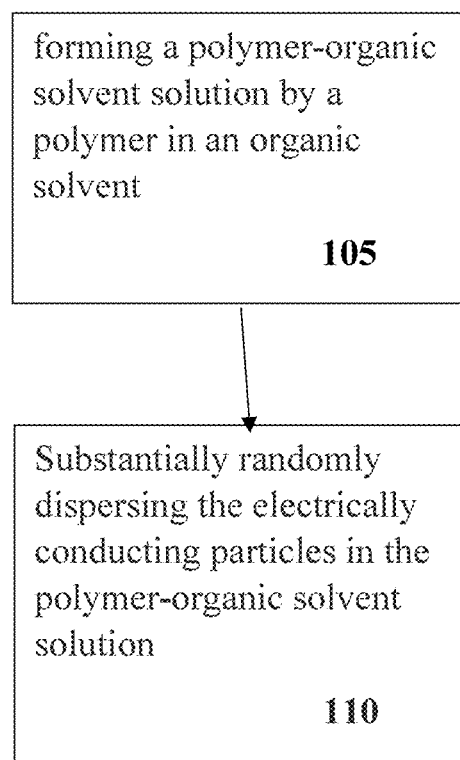
FIG. 5 shows a flowchart representation of an instantiation of a method of forming the shielding or reflecting material of these teachings.

One instantiation of the method of these teachings for making shielding or reflective material, shown in FIG. 5, includes forming a polymer-organic solvent solution by dissolving a polymer in an organic solvent (step 105, FIG. 5) and embedding electrically conducting particles in the polymer-organic solvent solution in a substantially random distribution by dispersing the electrically conducting particles in the polymer-organic solvent solution (step 110, FIG. 5). A percent weight of the electrically conducting particles dispersed in the polymer-organic solvent solution exceeding a predetermined percent weight. Each characteristic dimension of each one of the electrically conducting nanoparticles being larger than a predetermined dimensional quantity. A stirrer or sonicator can be used in dispersing the electrically conducting particles.

If it is desired to obtain a more substantially random distribution of the electrically conducting particles dispersed in the polymer-organic solvent solution, the dispersing can include delivering the electrically conducting particles in lines of particles are randomly placed along the line and then dispersing the electrically conducting particles.

In one instance, the polymer-organic solvent solution is a is a DNA or RNA-CTMA-organic solvent solution. The DNA or RNA-CTMA-organic solvent solution can be formed using the methods described in U.S. Pat. Nos. 9,408,336, 10,219,418, 11,026,358, and U.S. Patent Application Publication No. 20210400855, corresponding to U.S. patent application Ser. No. 17/334,113.

In one instantiation, the method of these teachings for forming an electromagnetically shielded device includes forming a film of the shielding or reflective material, formed by the method shown in FIG. 5, on at least of a portion of at least one surface of an object to be shielded by at least one of casting, spin depositing, spray coating, ink jet printing, vapor deposition, molecular vapor deposition or embossing, and drying the film of the shielding or reflective material.

In another instantiation, after forming the film, the upper surface of the film (the surface of the film not in contact with the at least a portion of the at least one surface of the object to be shielded) is shaped or undulated or corrugated and the film is then dried.

In yet another instantiation, after forming the (first) film, a second film is form disposed on the first film, the second film comprising another polymer-organic solvent solution, and the first film and the second film are then dried.

In a further instantiation, after forming the (first) film, a second film is formed disposed on the first film, the second film comprising another polymer-organic solvent solution with electrically conducting particles dispersed in the another polymer-organic solvent solution, and the first film and the second film are then dried.

Instantiation sing which a (first) film comprising another polymer-organic solvent solution, either comprising electrically conducting particles dispersed in it or not comprising electrically conducting particles dispersed in it, is formed on at least a portion of at least one surface of the object to be shielded, another (second) film is then formed, by the method shown in FIG. 5, on the first film, and the first film and the second film are then dried is also within the scope of these teachings.

Combinations of the above disclosed methods are also within the scope of these teachings.

In one instance, drying occurs a temperature between about 60° F. to about 80°.

Experiments conducted in a composite constituting Ag particles embedded in a DNA-CTMA polymer observe a strong attenuation (~60 dB) at 10-12 GHz within a film thickness of just tens of microns.

Figure 6:
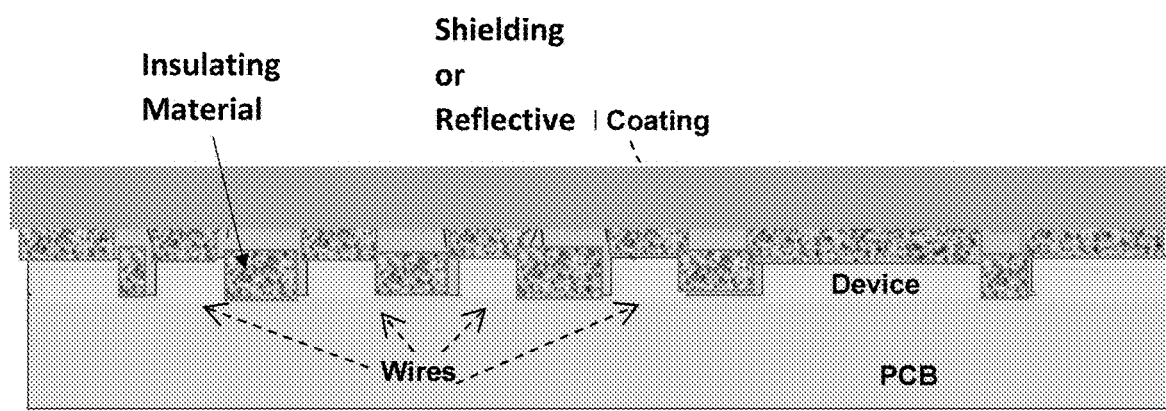
FIG. 6 is a schematic diagram of electromagnetically shielding coating over insulating material deposited on an object.

In another instantiation of the method of these teachings for forming an electromagnetically shielded device, the method also includes, before forming the film of the shielding or reflective material, depositing a layer of insulating material on at least a portion of the at least one surface of the object to be shielded. The film of the shielding or reflective material is then deposited on the insulating material. One instantiation is shown in FIG. 6. This instantiation enables providing EMI shielding between chips and wires on the circuit board itself. In some instances, the layer of insulating material is patterned and the layer of EMI shielding material film is disposed on areas of the pattern. The areas can be selected to provide EMI shielding between chips and wires on the circuit board itself. Providing EMI shielding between chips and wires on the circuit board itself be accomplished by depositing a thin layer, 5 nm to 10 nm of an insulating material including, but not limited to, nucleobases or organic polymers, on top of the circuit board and then depositing the shielding or reflective material of these teachings.

One instantiation of the method of these teachings for forming an electromagnetically reflective device includes selecting a thickness of a film of the shielding or reflective material, formed by the method shown in FIG. 5, such that, when electromagnetic radiation is incident on one surface of the film along one direction, electromagnetic radiation from the film has one component in the opposite direction of the electromagnetic radiation incident on the one surface of the film, forming the film on at least a portion of a surface of a substrate by at least one of casting, spin depositing, spray coating, ink jet printing, vapor deposition, molecular vapor deposition or embossing, and drying the film of the shielding or reflective material. In one instance, drying occurs a temperature between about 60° F. to about 80° In some instances, the substrate can be flexible.

Further instantiations, such as those described above for forming an electromagnetically shielded device, are also within the scope of these teachings for forming an electromagnetically reflective device.

In order to further elucidate these teachings, results applied to the high resolution electromagnetic calculation of a disorder system of metal particles in the polymer film are presented herein below for electromagnetic radiation at 10 GHz, which has a wavelength $3 \times 10^4$ μm corresponding to $k \approx 2 \times 10^{-4}$ μm$^{-1}$. It should be noted that these teaching are not limited to this illustrative instantiation or to a particular frequency. Further, the particle-polymer composites assume a completely disordered configuration with a typical mean free path, $l_{mfp} \sim 1$ μm for particle weight fractions typically used in practice.

The present problem is highly computationally demanding because of the vast disparity in spatio-temporal scales in the system. The Finite Difference Time Domain (FDTD) method, the technique of choice for electromagnetic modeling, requires that the light crossing time at the smallest spatial scales be resolved, in addition to evolving the simulation for a sufficiently long time in order to reach steady state. The largest scale is set by the wavelength of the incident radiation ($3 \times 10$ μm at 10 GHz) and the smallest scale is set by the skin depth of Ag at 10 GHz (~0.5 μm), which needs to be resolved by 10 grid points; a scale separation of r' 10 that places severe constraints on the time step, making this standard EM simulation approach impractical for the present problem. Instead, the Finite Difference Frequency Domain (FDFD) method (W. Shin, 3D finite-difference frequency-domain method for plasmonics and nanophotonics, Ph.D. thesis, Stanford University, 2013) is used. The FDFD approach solves the equations:

$$E(r,\omega) = -i\omega\mu(r,\omega)H(r,\omega) \quad (1)$$

$$H(r,\omega) = i\omega\varepsilon(r,\omega)E(r,\omega) + J(r,\omega) \quad (2)$$

where E and H are the electric and magnetic fields, $\varepsilon$ and $\mu$ are the electric permittivity and magnetic permeability, and J is the electric current source density. All quantities vary in space (denoted by r) for a fixed source frequency $\omega$.

For a given frequency, these large systems of linear equations can be solved either using iterative methods or using direct matrix inversion. Direct sparse matrix inversion which does not have the convergence limitation of iterative methods and is able to deal with arbitrary poorly conditioned numerical problems, is used.

A particle-polymer composite consisting of 1 μm Ag particles dispersed in a DNA-CTMA polymer is used. Transmission at 10 GHz for which a Drude model is assumed (see, for example, Handout 1 Drude Model for Metals—Cornell University, available at https://courses.cit.cornell.edu/mse5470/handout1.pdf), with a scattering time scale set by the DC conductivity for simplicity, is analyzed. For the DNA-CTMA polymer, $\Re(\varepsilon_{DNA}) = 4.6\varepsilon_0$ and $\Im(\varepsilon_{DNA}) = 0.2\varepsilon_0$.

While results for the Ag/DNA-CTMA composite are presented, the results are more general and are applicable to metal particles randomly dispersed in polymers. The generality arises because the predetermined dimensional quantity is the skin depth of the metal that constitutes the particles in the composite, which is less than 1 μm at 10 GHz for a wide range of metals. The polymer is passive with regard to the electromagnetic radiation, and its role is to purely provide structural support to the metal particles, which in itself is an important issue. Replacing the DNA-CTMA with PMMA makes the film brittle and break up into smaller flakes.

Figure 7A:
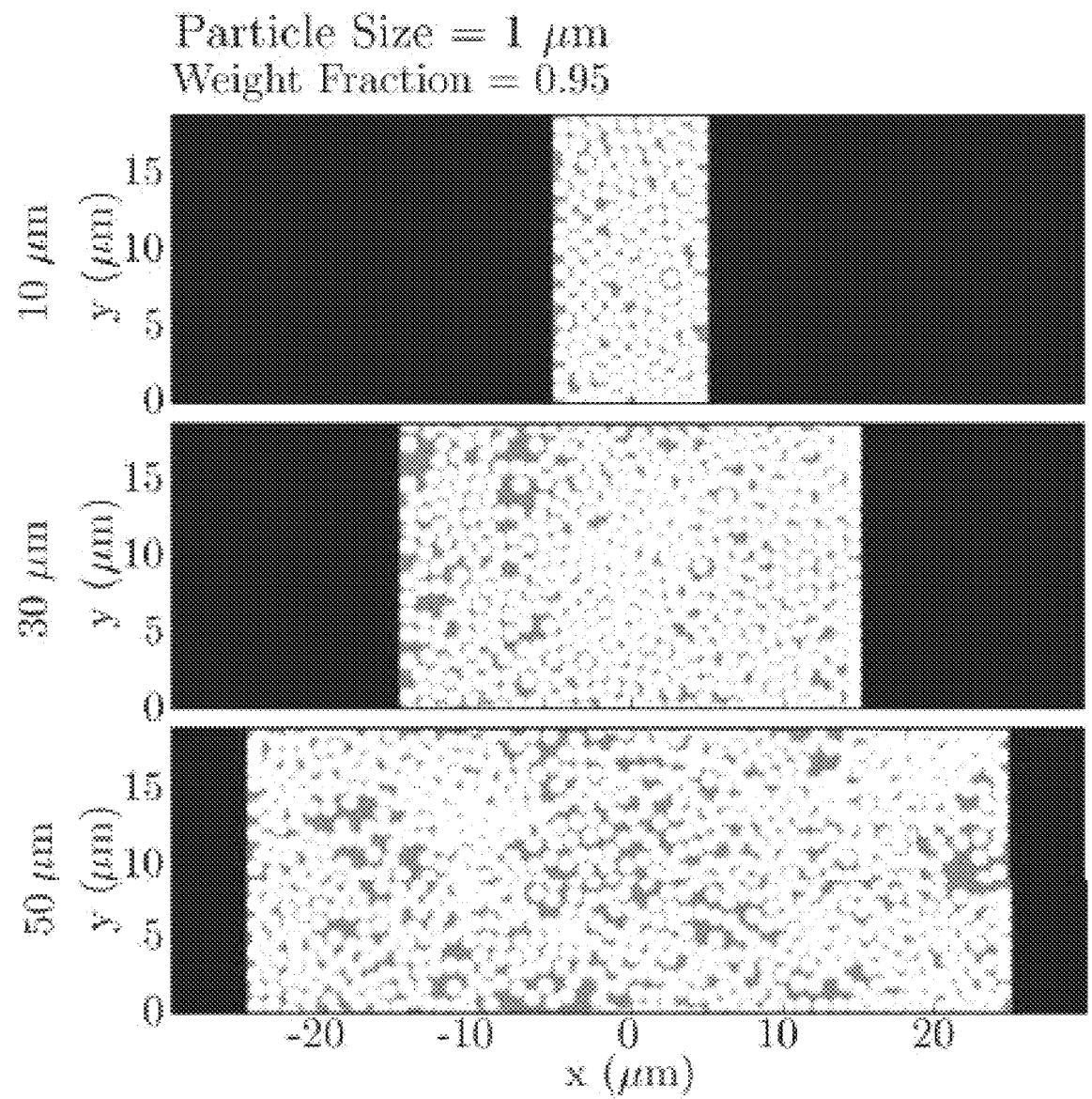
FIG. 7A depicts final particle configuration obtained in calculations corresponding to shows an instantiation of an electromagnetically shielded device of these teachings for an average value of the particle characteristic dimension.
Figure 7B:
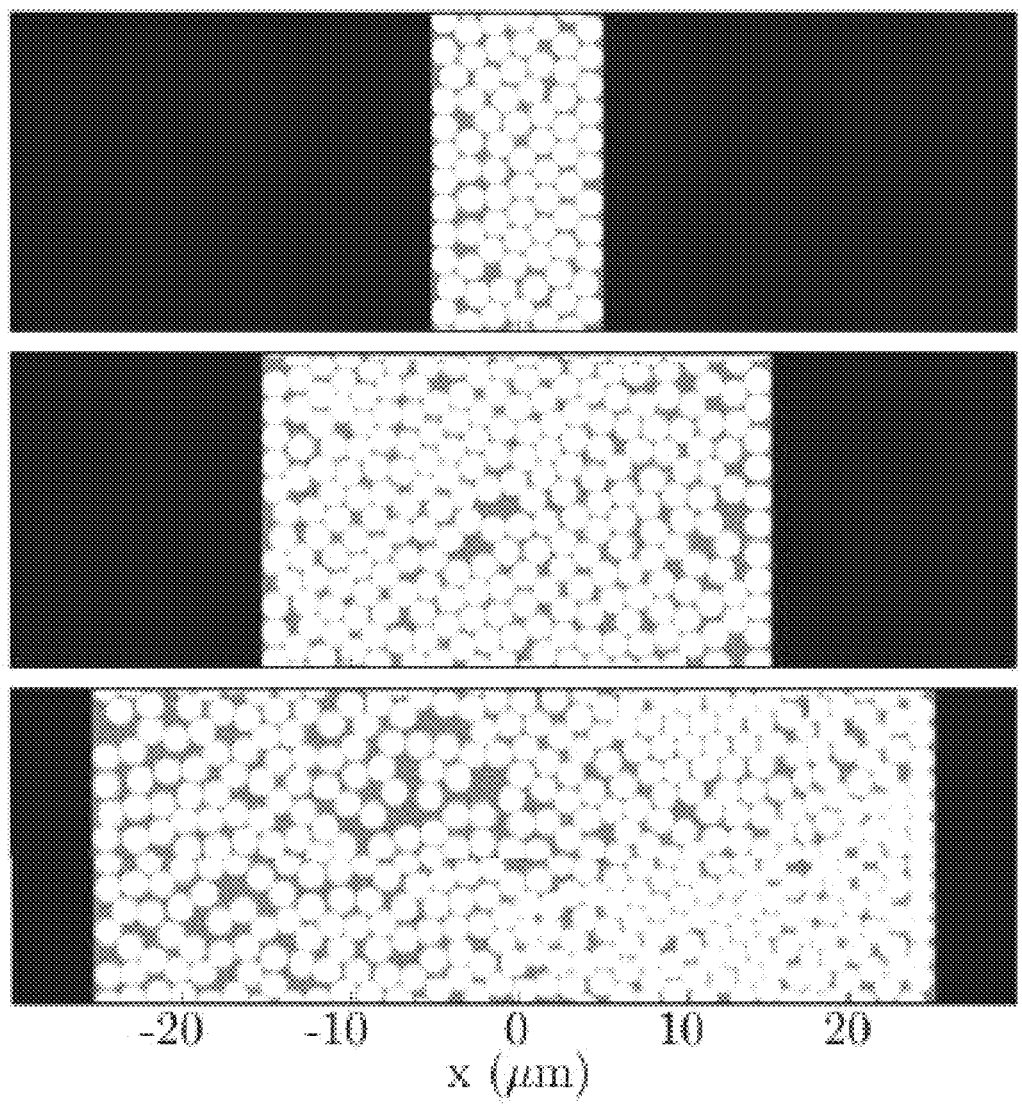
FIG. 7B depicts final particle configuration obtained in calculations corresponding to shows an instantiation of an electromagnetically shielded device of these teachings for another average value of the particle characteristic dimension.
Figure 7C:
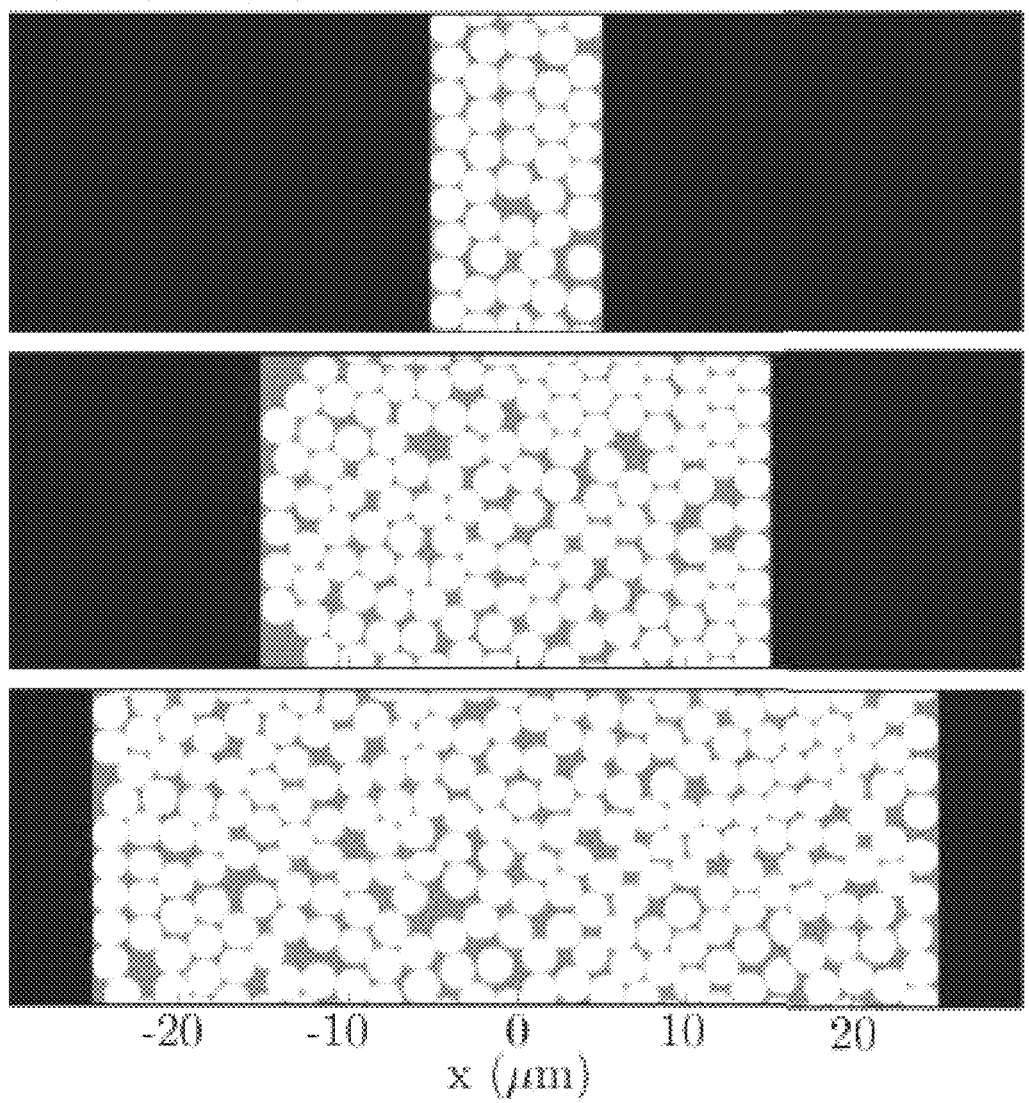
FIG. 7C depicts final particle configuration obtained in calculations corresponding to shows an instantiation of an electromagnetically shielded device of these teachings for yet another average value of the particle characteristic dimension.

The physical setup is inherently stochastic due to the random nature of the particle configurations. In order to obtain statistically significant results, we need to perform an ensemble average Therefore, simulations for a number of different particle configurations for each specific combination of particle diameter, weight fraction, film thickness and source frequency have been performed. The results are free of fluctuations arising from sampling different particle configurations when the nanoparticle system is either fully transmitting or reflecting. However, the transition between the transmitting and reflecting states is fluctuation-dominated, and a much larger ensemble (25 configurations) for each combination of macroscopic parameters during the transition was performed. In all, 2825 simulations where performed, each with a spatial resolution of 0.1 μm over a domain 2200 μm×18.9 μm (grid size $N_x \times N_y = 22002 \times 189$) with periodic boundaries along y and perfectly matched layers along x to simulate infinite boundaries. A line source for $J_y$ is placed at the left end of the domain and the fields are measured at a line probe around 1000 μm after the film. The power is given by the Poynting vector along x $|S_x| = |E_y * B_z|$ and the transmission is computed using $10 \log(|S_x|/|S_x^{ref}|)$, where $S_x^{ref}$ is transmitted power in a reference simulation which contains no film Each particle configuration, for a given weight fraction, particle diameter and film thickness are obtained by minimizing the following energy functional to remove sphere intersections, Thickness is obtained by minimizing the following energy functional designed to remove sphere intersections, $$E(x_1, x_2, \ldots, x_N) = \sum_{i=1}^{N}\sum_{j=1}^{i-1} R((1+\eta)d - |x_i - x_j|) \quad (3)$$

where xi are the spatial coordinates of the particles i=1, 2, . . . , N, where N is the total number of particles. R(x)=xΘ(x) is the unit ramp function and η=0.05 is a margin for spacing out the particles. Note that the distance between particles |xi−xj| is computed with a minimum-image convention in the periodic direction. The optimization is done with the L-BFGS-B (Limited memory Broyden-Fletcher-Goldfarb-Shanno Bounded) optimizer implemented in the scipy library, using the bounds to enforce that the particles remain within the film thickness. Examples of final particle configurations obtained after performing the minimization are shown in FIGS. 7A-7C. FIGS. 7A-7C show some final particle configuration states for different weight fractions, particle diameters and film thicknesses. The particles are shown in white, the DNA background in grey, with black denoting free space.

Figure 8:
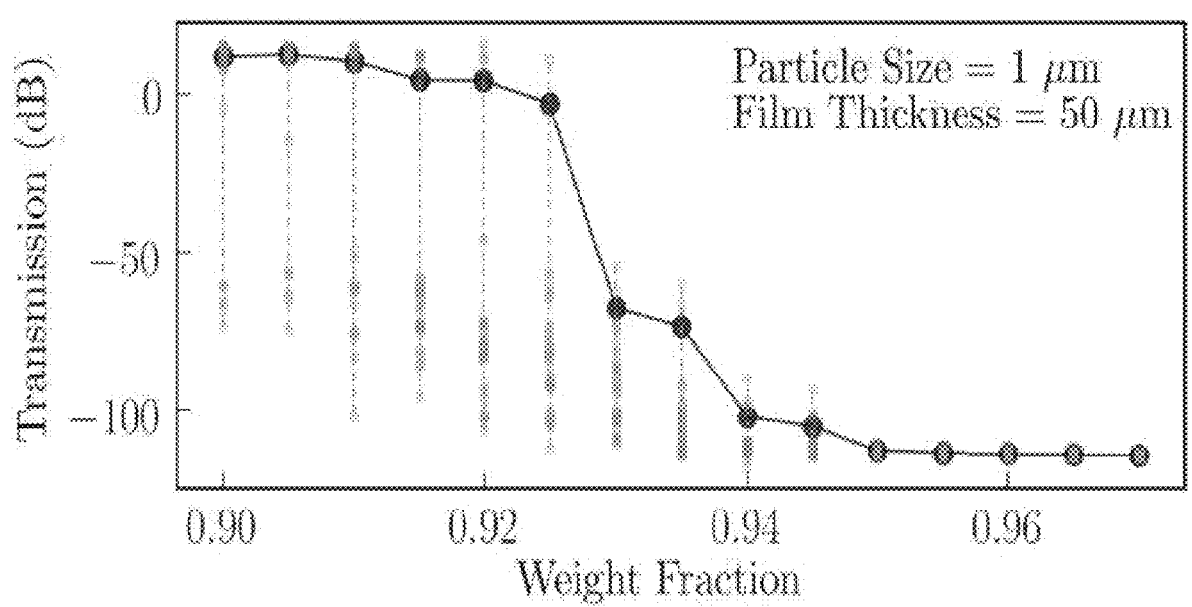
FIG. 8 shows electromagnetic transmission versus weight fraction obtained in calculations corresponding to shows an instantiation of an electromagnetically shielded device of these teachings for an average value of the particle characteristic dimension and a film thickness.

While not desiring to be bound by theory, in one interpretation the results can be seen as Anderson localization and Anderson localization requires sufficient disorder, both in terms of the strength of the scatterer and in terms of number of scatterers. The weight fraction of Ag particles in the composite it is varied, and the resulting dependence of the attenuation is examined, as shown in FIG. 8. FIG. 8 shows transmission vs weight fraction around a transmitting-attenuating transition for particle diameter 1 µm. The red markers denote the values of the transmission for each of the 25 particle configurations in the ensemble, and the black marker denotes the mean over the ensemble. Notably, there are large fluctuations during the transition, which subside when the attenuating state has fully set in.

Figures 9A, 9B, 9C:
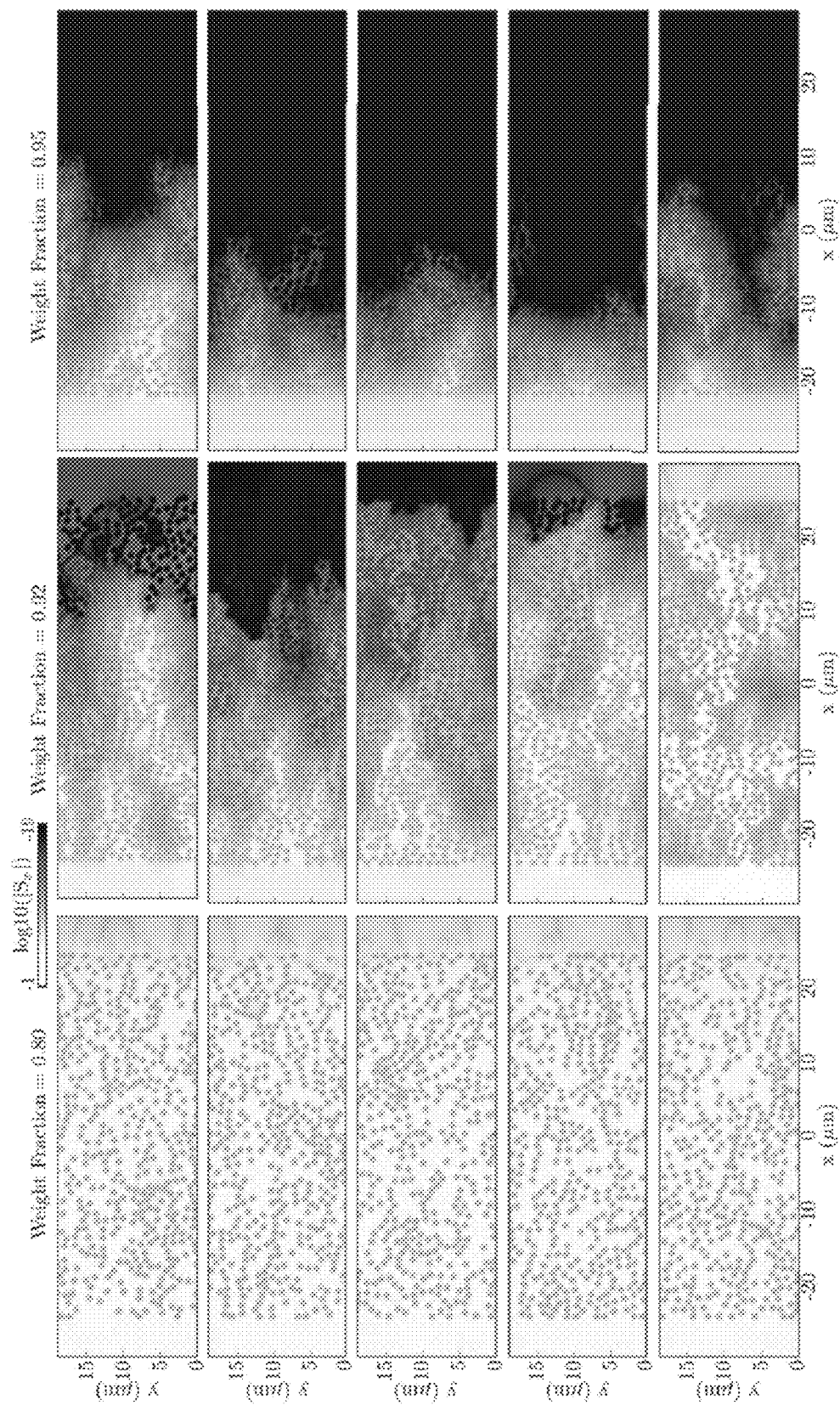
FIGS. 9A, 9B, and 9C show spatial profiles of the Poynting vector obtained in calculations corresponding to shows an instantiation of an electromagnetically shielded device of these teachings for an average value of the particle characteristic dimension and a film thickness and various weight factors.

FIGS. 9A, 9B, 9C show spatial profiles of the Poynting vector in a film of thickness 50 µm containing particles of diameter 1 µm. (Left column) a transmitting state (weight fraction w=0.80), (middle column) critical state (w=0.92), (right column) reflecting/attenuating state (w=0.95). Each row is a distinct configuration of particles. Note the striking spatial structure and strongly-configuration dependent transmission that arises at criticality All configurations have a film thickness of 50 µm, with the source frequency set to 10 GHz and particle diameter 1 µm. For each weight fraction w, there are 25 different particle configurations. The transmitted power for each of the individual configurations is shown using a (red) marker, connected together by a dotted (red) line. Therefore, the vertical extent of the line indicates the magnitude of the fluctuations. The ensemble average is shown using a black marker, which is only visible when there is a significant spread in the transmission between each configuration. As w is varied, the transmission is nearly constant, before abruptly dropping at w≃0.92. As the transmission drops, strong variability between transmission through different particle configurations is observed. As w is increased further, the fluctuations subside, and the nanoparticle system becomes completely reflecting (transmission≃−114 dB.

The dependence of the transmission on the weight fraction is striking: the sudden decrease in transmitted power is strongly indicative of a state transition and has immediate experimental consequences; if the film is intended to reflect, then the particle weight fraction w exceeds a definite threshold. Conversely, if in the transmitting state, no improvement in the reflected power can be achieved by a progressive increase in the weight fraction. The conceptual picture of a transition between two distinct states is further bolstered by examining the fluctuations, which are large precisely during the transition between the transmitting and reflecting states. The spatial profiles of the electromagnetic power across the film for an ensemble of particle configurations at w=0.92 are observed (FIGS. 9A-9C), where fluctuations are dominant. Notably, the radiation has a highly complex spatial structure at the transition, in contrast with a much simpler profile before and after the state transition.

To quantify the strength of the attenuation, a reference value is selected. This reference value is given by a solid film made of the same metal that constitutes the particles in the particle-polymer composite. For a 50 µm film made of Ag, the transmission is ≃−115 dB.

Next, the strength of the scattering is controlled by varying the resistivity of the metal particles, which reduces the effectiveness of the EM scattering of the metal particles A disordered composite film with metal weight fraction of 0.95 is considered, which has been seen previously is in the localized state. Shown below is the comparison between the transmission in the composite film versus a solid film of the same material. A transition appears as $\rho/\rho Ag$ is varied from $10^4$ to $10^3$, below which the system is reflecting and above which the system is transmitting. The reflection efficiency, which is defined by the ratio of the transmission of the composite film and the solid film, progressively improves as the scatterer strength is increased before finally reaching the limit for $\rho=\rho_{Ag}$.

| $\rho/\rho Ag$ | Composite film (dB) | Solid film (dB) |
|---|---|---|
| 1 | −113.4 | −115.5 |
| 10 | −83.9 | −114.8 |
| $10^2$ | −42.3 | −85.5 |
| $10^3$ | −27.9 | −53.28 |

Figure 10:
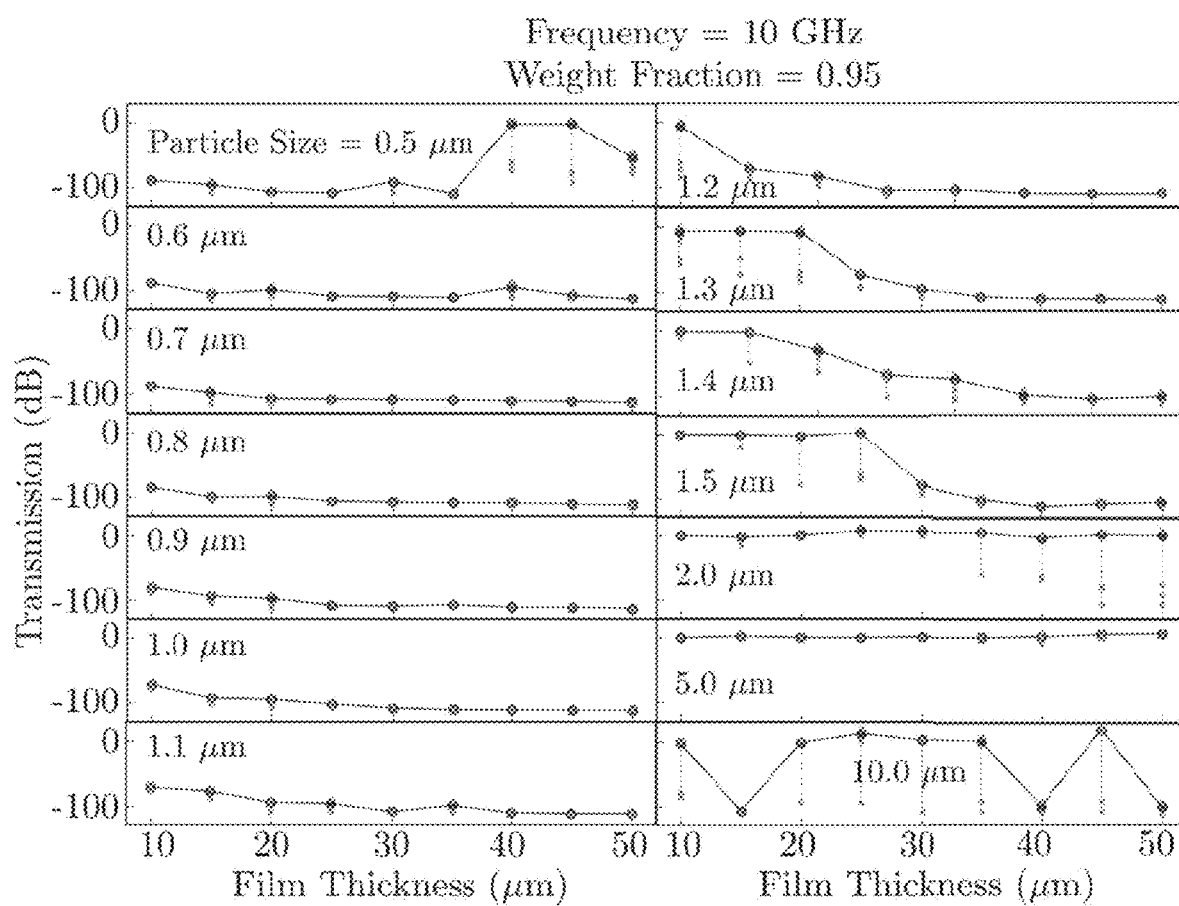
FIG. 10 shows transmission versus film thickness obtained in calculations corresponding to shows an instantiation of an electromagnetically shielded device of these teachings for a given weight fraction and various characteristic particle sizes.

The dependence of the transmitted power for varying weight fractions and particle diameters, for a fixed film thickness of 50 µm and source frequency of 10 GHz has been observed. The dependence on film thickness is considered hereinbelow, fixing the weight fraction to 0.95 (i.e., in the reflecting/attenuating state seen in the previous section), and as before, the source frequency to 10 GHz. The purpose of this group of calculations is to check if there is a film thickness beyond which attenuation occurs, just as in the case of the weight fraction dependence. FIG. 10 shows the transmitted power for a range of particle diameters, as the film thickness is varied, and FIG. 5 shows the spatial profiles of the Poynting vector. For particle sizes 0.6-1.1 µm, there is strong attenuation even for the smallest film thickness considered (10 µm), with a modest increase in the attenuation for increasingly thick films. As the particle diameter is increased (e.g., at 1.5 µm), there is again a state transition: for thin films, the system transmits all incident power, but becomes attenuating above a determined thickness. As the particle diameter is made much larger than the skin depth (2, 5, 10 µm), the system is fully transmitting for all thickness considered. This result can be understood, given the condition that the density exceed a threshold (given by $kl_{mfp}<1$, in the localization framework): satisfying this condition results in a definite concentration of scatterers. As particle size is increased with the weight fraction kept constant, the concentration of scatterers decreases, and thus the condition is not satisfied.

The above described calculations suggest the following, when the predetermined concentration lower limit is obtained by $kl_{mfp}<1$ and the particle characteristic dimension lower threshold: is given by the skin depth:

Particle sizes and film thicknesses—the concentration lower limit requires a sufficient number of scatterers within a given film volume. This can set an upper limit to the particle size, when the film volume is fixed. From the calculations, the results indicate that particles about two skin depths in characteristic dimension provide good results and, a film thickness of about 46 skin depths or thicker is needed Particle composition—the requirement that the particle characteristic dimension is satisfied by a range of metals, for example, Al, Cu, Ag, all of which have a sub-micron skin depth. The frequency range of applicability extends into the terahertz regime, where the calculations show that the DNA-CTMA/Ag composite displays an attenuation of ≃37 dB, which is close to the attenuation by a solid Ag film at 1 THz. Applying these teachings, attenuations similar to those of solid films can be obtained Particle configuration: these teachings relate to electrically conducting particles substantially randomly dispersed in the polymer solution.

Polymer composition—in these teachings, the polymer plays a passive role with regard to the EM propagation, and its only role is to provide structural support to the metal particles. Therefore, candidate polymers can be assessed based on their structural properties when embedded with the metal particles Absorption:—ohmic dissipation is not needed for these teachings. In these teachings, electromagnetic attenuation results from reflection scattering. This provides an advantage to the present teachings because the shielding material are not heated by ohmic dissipation.

Percolation: The percolation threshold, in percolation theory, is the concentration threshold at which there is formation of long-range connectivity in random systems: The concentration threshold obtained by $kl_{mfp}<1$, as used in the calculations for these teachings, is lower than the percolation threshold. Systems of these teachings would have a concentration below the percolation threshold.

Electromagnetically shielded devices of these teachings experience shielding against unwanted electromagnetic radiation across a wide range of frequencies—from kilohertz to terahertz. This is especially relevant for electronics that will work in the upcoming 6G band, which is in the terahertz regime. The proposed polymer composite is highly flexible and does not require to be grounded. Further, it does not absorb the incident radiation and so does not heat up, thus allowing it to be used on sensitive electronics.

High shielding efficiency can be obtained by these teachings. These teachings can be applied over a large range of frequencies. The calculations presented herein indicate that shielding up to several terahertz is possible. Because electromagnetic shielding according to these teachings does not rely on ohmic dissipation, there is minimal absorption of incident electromagnetic radiation and minimal heating. The shielding material is highly flexible and conformable. The shielding material layer of these teachings is typically a number of microns, resulting in a thin material layer.

In one instance, a typical photonic band gap is created using a regular lithographic pattern of holes and can only prevent propagation in a certain frequency band. The device fails to confine radiation to within the waveguide for frequencies outside the photonic band gap, i.e., the device can no longer serve as a waveguide.

In one or more instances, the device of these teachings for obtaining, in a dielectric material volume, selective propagation of electromagnetic radiation in predetermined frequency bands includes a dielectric material volume extending from a first surface to a second surface, a first number of cavities, a second number of cavities, each cavity from the first and second numbers extending from the first surface to the second surface, the first number of cavities being located in a first sub-volume of the dielectric material volume, the second number of cavities being located in a second sub-volume of the dielectric material volume, the first sub-volume and the second sub-volume being separated by a channel volume. The first number of cavities is distributed throughout the first sub-volume in a substantially random pattern. The second number of cavities is distributed throughout the second sub-volume in another substantially random pattern. Each cavity from the first and second numbers of cavity is substantially filled with an electrically conducting material. A concentration of the first number of cavities distributed throughout the first sub-volume exceeds a predetermined concentration. A concentration of the second number of cavities distributed throughout the second sub-volume exceeds the predetermined concentration. A characteristic dimension of each cavity from the first and second numbers of cavities is larger than a predetermined dimensional quantity.

In that instantiation of the device of these teachings for obtaining, in a dielectric material volume, selective propagation of electromagnetic radiation in predetermined frequency band the regular pattern is replaced by a substantially random pattern of holes, in which a suitable electrically conducting material is deposited. The shape of the hole which constitutes the pattern may be any pattern, such as, but not limited to, square, rectangle, circle, etc. The size of the hole should exceed a certain predetermined value.

When the concentration of the substantially randomly distributed first number of cavities distributed throughout the first sub-volume exceeds a predetermined concentration and a concentration of the substantially randomly distributed second number of cavities distributed throughout the second sub-volume exceeds the predetermined concentration, sinusoidal wave propagation does not occur inside the first and second sub-volumes. When the above situations exist, the random configuration of metal-filled cavities reflects all radiation incident upon it and serves to confine the radiation in the channel volume, as desired.

While not desiring to be bound by theory, in one interpretation the results can be seen as Anderson localization and Anderson localization requires sufficient disorder, both in terms of the strength of the scatterer and in terms of number of scatterers.

The advantage of using a substantially random pattern of metal-filled holes is that one has access to a much larger range of frequencies where the radiation can be guided. The proposed device is expected to function as a waveguide all the way up to the plasma frequency of the metal deposited in the holes. The device of these teachings is advantageous compared to a 2D waveguide etched in a metal, where resistive losses can be significant.

As stated above, in one instance, the predetermined concentration of the substantially randomly dispersed electrically conducting particles is related to the mean free path of photons in the medium with the substantially randomly dispersed electrically conducting particles and the effective wavelength of the incident radiation. As also stated above, one instantiation of the predetermined dimensional quantity is one or a multiple of the skin depth at a characteristic frequency, the depth at which the field drops to 1/e of the incident value.

While not desiring to be bound by theory, in one interpretation the results can be seen as Anderson localization and Anderson localization requires sufficient disorder, both in terms of the strength of the scatterer and in terms of number of scatterers.

Figure 11:
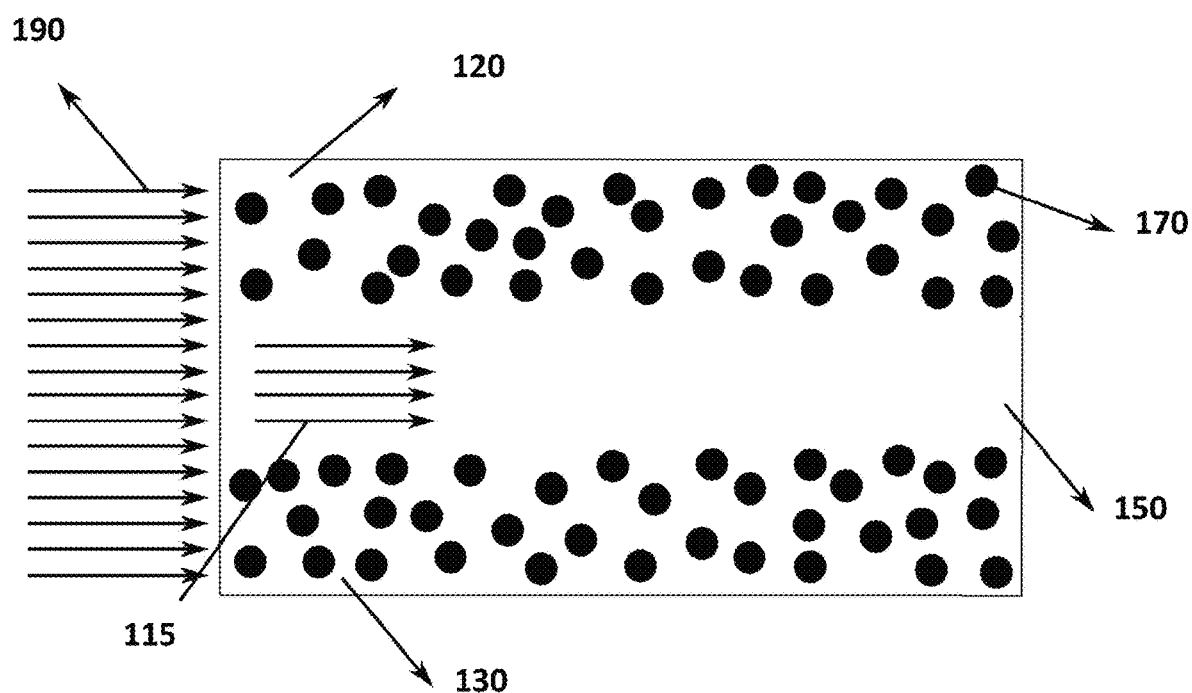
FIG. 11 depicts a top view of one instantiation of the device of these teachings for obtaining, in a dielectric material volume, selective propagation of electromagnetic radiation in predetermined frequency band.
Figure 12:
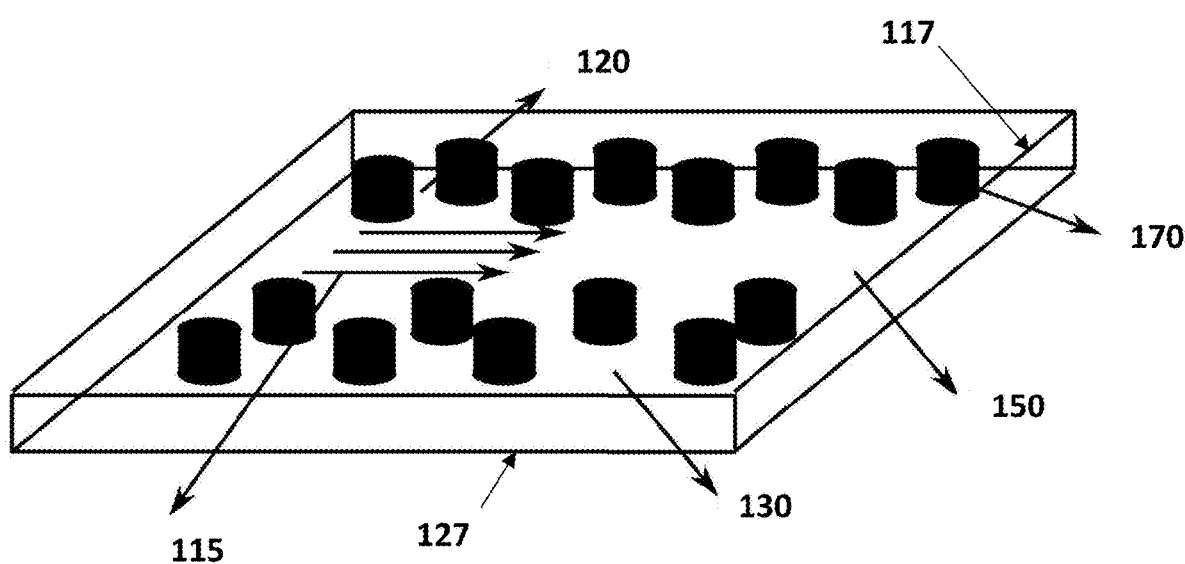
FIG. 12 depicts an isometric view of the instantiation of the device of these teachings for obtaining, in a dielectric material volume, selective propagation of electromagnetic radiation in predetermined frequency band shown in FIG. 11.

FIG. 11 shows a top view of one instantiation of the device of these teachings in which electromagnetic radiation is guided using a channel created within a random arrangement of electrically conductive material filled cavities in the dielectric material volume. (The dielectric material can be any dielectric such as silicon, polymeric films, etc.) FIG. 12 shows an isometric view of the instantiation of the device of these teachings shown in FIG. 11. Referring to FIGS. 11 and 12, in the instantiation shown therein, electromagnetic radiation 190 is incident upon the dielectric material volume which includes the first sub-volume 120, the second sub-volume 130 and the channel volume 150. Cavities filled with electrically conducting material 170 are substantially randomly dispersed through the first sub-volume 120 and the second sub-volume 130. In the instantiation shown in FIGS. 11 and 12, there are no cavities in the channel sub-volume 150. Electromagnetic radiation 115 propagates through the channels sub-volume 150. The width of the channel sub-volume 150 is selected to obtain selective propagation of electromagnetic radiation in predetermined frequency bands. In one instance, the electrically conductive material can be a metal.

However, instantiations in which cavities are placed in the channel sub-volume 150 in a nonrandom distribution or are placed in the channel sub-volume 150 in a substantially random distribution having a concentration less than the predetermined threshold concentration, would also allow for electromagnetic radiation propagation through the channel sub-volume 150 although the cavities, whether filled or not, in that situation would cause scattering. The distance between the first surface 127 and the second surface 117 of the dielectric material volume and the width of the dielectric material volume defined volume. Instantiations in which a third number of cavities is distributed throughout the channel sub-volume 150 in a nonrandom predetermined pattern are within the scope of these teachings. That third number of cavities can be empty or filled with an electrically conductive material. In one instance, the electrically conductive material can be a metal.

Instantiations in which a distance from the first surface 127 to the second surface 117 is larger than the larger than the predetermined dimensional quantity and smaller than a predetermined distance obtained from the predetermined concentration are within the scope of these teachings. In one instance, a distance from the first surface 127 to the second surface 117 is larger than the larger than the predetermined dimensional quantity and smaller than a predetermined distance obtained from the predetermined concentration are within the scope of these teachings. Instantiations in which comprising a dielectric layer (210, FIG. 13) is disposed on one of the first surface 127 or the second surface 117 of the dielectric material volume (220, FIG. 13) are also within the scope of these teachings.

Figure 13:
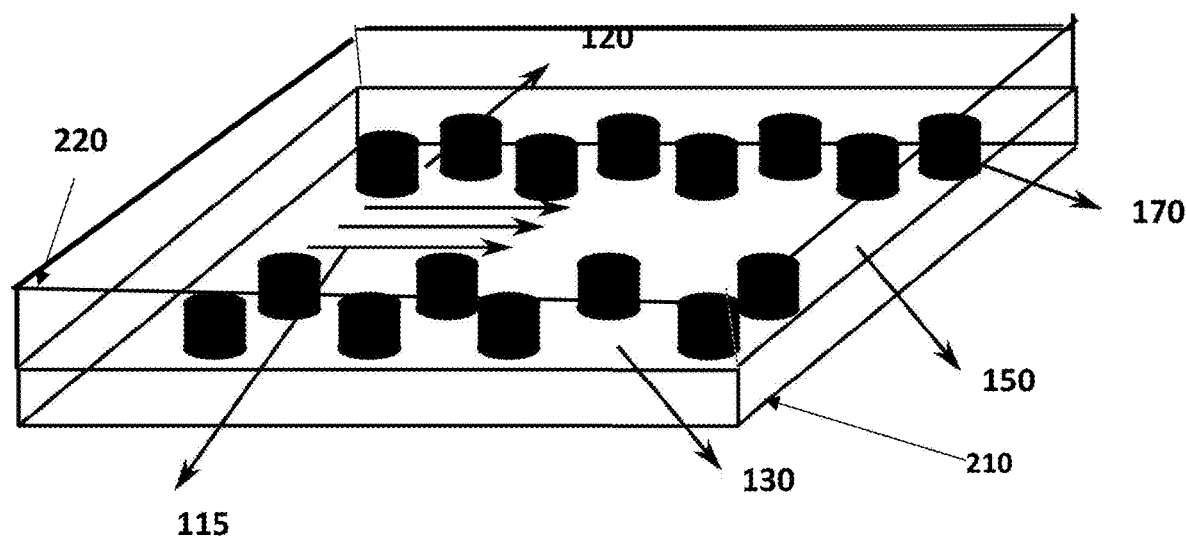
FIG. 13 shows another instantiation of the device of these teachings for obtaining, in a dielectric material volume, selective propagation of electromagnetic radiation in predetermined frequency band.

Instantiations in which a height of the dielectric layer (210, FIG. 13) is less than the predetermined distance obtained from the predetermined concentration are also within the scope of these teachings. Those instantiations, such as shown in FIG. 13, where the distance from the first surface 127 to the second surface 117 is larger than the larger than the predetermined dimensional quantity and smaller than a predetermined distance obtained from the predetermined concentration, provide a subcomponent, where subcomponents can be stacked to form a three dimensional distribution of substantially randomly distributed electrically conductive material filled cavities.

Figure 14B:
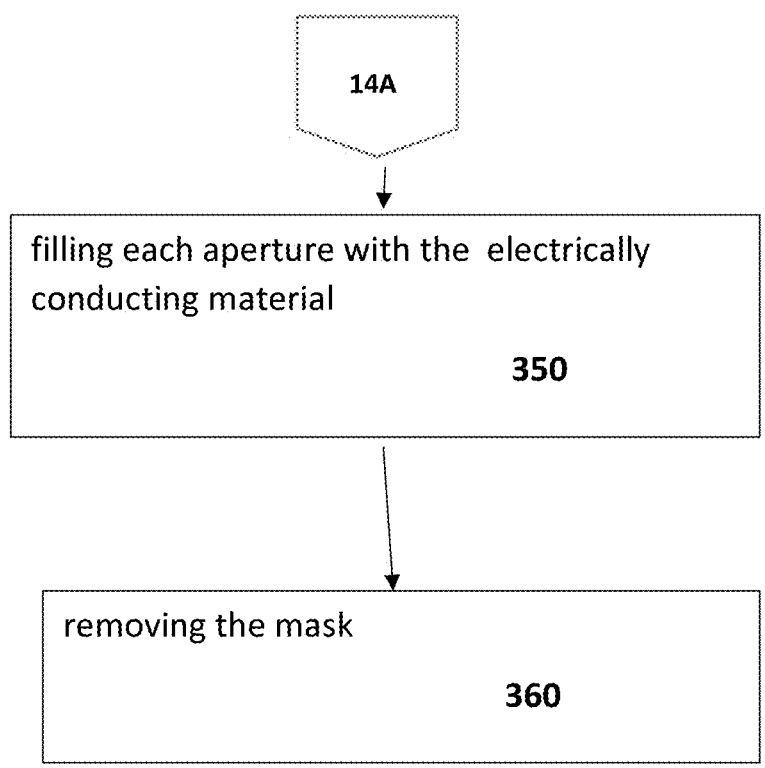

In one or more instances, the method of these teachings for obtaining, in a dielectric material volume, selective propagation of electromagnetic radiation in predetermined frequency band includes obtaining, for a second surface of the of the dielectric material volume, the dielectric material volume extending from a first surface to a second surface, a distribution of the first number of cross-sectional areas distributed throughout a first sub-area, a concentration of the first number of cross-sectional areas exceeding a predetermined concentration, and a distribution of a second number of cross-sectional areas distributed throughout a second sub-area, a concentration of the second number of cross-sectional areas exceeding a predetermined concentration (step 310, FIG. 14A). The first sub-area and the second sub-area are separated by a channel area, The second surface includes the first sub-area, the second sub-area and the channel area. The first number of cross-sectional areas is distributed throughout the first sub-area in a substantially random pattern. The second number of cross-sectional areas being distributed throughout the second sub-area in another substantially random pattern. A characteristic dimension of each cross-sectional area from the first and second numbers of cross-sectional areas is larger than a predetermined dimensional quantity. The method also includes forming a mask, to be disposed on the second surface (step 320, FIG. 14A), the mask having an opening at each cross-sectional area from the first and second numbers of cross-sectional areas, disposing the mask on the second surface of the dielectric material volume (Step 330, FIG. 14A), removing, from the second surface to the first surface, material of the of the dielectric material volume under the opening at each cross-sectional area from the first and second numbers of cross-sectional areas, thereby forming cavities from the second surface to the first surface (step 340, FIG. 14A), an cavity at the opening at each cross-sectional area from the first and second numbers of cross-sectional areas, deposit electrically conducting material into each cavity, substantially, thereby filling each cavity with the electrically conducting material (Step 350, FIG. 14B), and removing the mask (Step 360, FIG. 14B).

Forming the mask can be performed by a number of methods, the usually used methods being in the methods of photolithography (photolithography including lithography in other frequency ranges). Removing the material can also be performed by a number of methods, the frequently used methods in electronic processing being methods of etching. Depositing the electrically conductive material and can be performed by a variety of methods used in semiconductor processing. Mask removal can also be performed by methods used in semiconductor processing.

In one instance, the electrically conducting material is a metal or metal alloy. In another instance, characteristic dimensions of the channel area are selected to obtain selective propagation of electromagnetic radiation in predetermined frequency bands.

In a further instance, a distribution of a third number of cross-sectional areas, the third number of cross-sectional areas being distributed throughout the channel area, is obtained. The distribution of the third number of cross-sectional areas can be nonrandom or substantially random but not meeting the requirement of the concentration exceeding the predetermined concentration. The mask then also includes the third number of cross-sectional areas and material is removed in the channel volume, thereby forming a third number of cavities in the channel volume extending from the second surface to the first surface. Instantiations in which the cavities are left empty and instantiations in which the cavities are filled with an electrically conductive material are both within the scope of these teachings. In some instantiations, the electrically conductive material can be a metal or metal alloy.

In another instantiation, a distance from the first surface to the second surface is larger than the larger than the predetermined dimensional quantity and smaller than a predetermined distance obtained from the predetermined concentration. In that instantiation, A dielectric layer can be disposed or deposited on one of the first surface or the second surface, where a height of the dielectric layer is less than the predetermined distance obtained from the predetermined concentration. In that manner, a module can be constructed where subsequent modules can be stacked and a three dimensional structure formed. When the modules are stacked, the substantially random distribution of the cavities in subsequent modules have to take into account the presence of the previous module.

In obtaining the substantially random distribution of the cross-sectional areas, a variety of methods can be used, usually relying on the obtaining of pseudorandom numbers. There are a number of algorithms for obtaining pseudorandom numbers either in a lines sector or in an area. There are available algorithms in engineering design programs such as Matlab® or Wolfram Mathematica®. (See, for example, Generating Pseudorandom Numbers, https://www.mathworks.com/help/stats/generating-random-data.html, accessed on Dec. 31, 2021.)

Although obtaining the substantially random distribution of the cross-sectional areas by any of the available methods would be within the scope of these teachings, one such method is described herein below in order to provide guidance to one embarking on generating one such method.

One approach to generate a random pattern would be to start with positioning the cross-sectional areas along one line, we select one initial cross-sectional area. Then we can randomly find the location of the next cross-sectional area so that it is randomly placed in the line segment extending from two radii (plus a clearance) away from the center of the initial cylinder to one radius plus the average photon mean free path away from the center of the initial cylinder. Once one has the next cross-sectional area along the line, one repeats the process. Once that first line of cross-sectional areas is found, we can similarly define areas away from the cross-sectional areas on that first line so that the next group of cross-sectional areas has centers that are a random distance away from the initial group, the distance being between two radii and two radii plus the average photon mean free path. One starts with the first cross-sectional area from the second group and once one places it, one redefines the area considered so that the next cross-sectional area in that group satisfies all the criteria with respect to the first group and the previous cross-sectional area from the second group. (See, for guidance, Generate Random Number inside a closed area—(mathworks.com) accessed on Dec. 30, 2021, https://mathworld.wolfram.com/LinePointPicking.html accessed Dec. 21, 2021, RandomPoint—Wolfram Language Documentation accessed on Dec. 30, 2021, which are incorporated by reference herein in their entirety and for all purposes. See also, for informational probability distributions, J. Philip, "The Probability Distribution of the Distance between Two Random Points in a Box," Technical Report Number TRITA MAT 07 MA 10, 1991. http://www.math.kth.se/~johanph/habc.pdf, George Marsaglia, B. Narasimhan & Arif Zaman (1990) The distance between random points in rectangles, Communications in Statistics—Theory and Methods, 19:11, 4199-4212, which are incorporated by reference herein in their entirety and for all purposes.)

For the purpose of better describing and defining the present teachings, it is noted that terms of degree (e.g., "substantially," "about," and the like) may be used in the specification and/or in the claims. Such terms of degree are utilized herein to represent the inherent degree of uncertainty that may be attributed to any quantitative comparison, value, measurement, and/or other representation. The terms of degree may also be utilized herein to represent the degree by which a quantitative representation may vary (e.g., ±10%) from a stated reference without resulting in a change in the basic function of the subject matter at issue.

Although these teachings have been described with respect to various instantiations, it should be realized these teachings are also capable of a wide variety of further and other instantiations within the spirit and scope of the appended claims.

What is claimed is:

1. A material component comprising:
   a polymer solution comprising a polymer dispersed in a solvent; and electrically conducting particles substantially randomly dispersed in the polymer solution; a concentration of the electrically conducting particles dispersed in the polymer solution exceeding a predetermined concentration; each characteristic dimension of each one of the electrically conducting particles being larger than a predetermined dimensional quantity.

2. An electromagnetically shielded device, comprising: an object to be shielded; and shielding material disposed on at least a portion of at least one surface of said object; the shielding material comprising a first layer comprising the material component of claim 1.

3. The electromagnetically shielded device of claim 2 wherein the polymer solution comprises the polymer dissolved in organic solvents; and wherein the organic solvents comprise at least one of butanol, ethanol, methanol, a chloroform/alcohol blend or ionic solvents.

4. The electromagnetically shielded device of claim 3 wherein the polymer comprises at least one of Poly-THF melts, polyamides, such as polyamide 6, polyamide 8 and polyamide 11, polyester, PET, polystyrene, polydivinylbenzene, polymethyl methacrylate, polyisoprene, Polyvinyl acetate, polyethylene glycol or a biopolymer.

5. The electromagnetically shielded device of claim 4 wherein the biopolymer comprises at least one of a DNA-lipid based complex or an RNA-lipid based complex.

6. The electromagnetically shielded device of claim 2 wherein the electrically conducting particles comprise metal particles.

7. The electromagnetically shielded device of claim 2 wherein at least one surface of the shielding material comprises at least one of a shaped surface, and undulated surface or a corrugated surface.

8. The electromagnetically shielded device of claim 2 wherein the shielding material also comprises a second layer comprising another polymer; the second layer disposed on the first layer and not in contact with at least a portion of the at least one surface of said object.

9. The electromagnetically shielded device of claim 8 wherein other electrically conducting particles are dispersed in another polymer.

10. The electromagnetically shielded device of claim 2 wherein the shielding material also comprises a second layer comprising another polymer; the second layer disposed between the first layer and the at least a portion of the at least one surface of said object.

11. The electromagnetically shielded device of claim 10 wherein other electrically conducting particles are dispersed in the another polymer.

12. A reflecting device comprising: a substrate or object; and a reflecting material disposed on at least of a portion of a surface of the substrate or object; the reflecting material comprising a first layer comprising the material component of claim 1; wherein the polymer solution comprises a polymer dissolved in solvents.

13. The reflecting device of claim 12 wherein the polymer is dissolved in organic solvents; and wherein the organic solvents comprise at least one of butanol, ethanol, methanol, a chloroform/alcohol blend or ionic solvents.

14. The reflecting device of claim 12 wherein the substrate or object is flexible.

15. The reflecting device of claim 12 wherein the electrically conducting particles comprise metal particles.

16. The reflecting device of claim 12 wherein the polymer comprises at least one of Poly-THF melts, polyamides, such as polyamide 6, polyamide 8 and polyamide 11, polyester, PET, polystyrene, polydivinylbenzene, polymethyl methacrylate, polyisoprene, Polyvinyl acetate, polyethylene glycol- or a biopolymer.

17. The reflecting device of claim 12 wherein at least one surface of the reflecting material comprises at least one of a shaped surface, and undulated surface or a corrugated surface.

18. The reflecting device of claim 12 wherein the reflecting material also comprises a second layer, the second layer comprising another polymer; the second layer disposed on a first layer, the first layer comprising the polymer dissolved in organic solvents and the electrically conducting particles, the second layer not being in contact with the at least a portion of the at least one surface of said object.

19. The reflecting device of claim 18 wherein other electrically conducting particles are dispersed in the another polymer.

20. The reflecting device of claim 12 wherein the reflecting material also comprises a second layer comprising another polymer; the second layer disposed between a first layer, the first layer comprising the polymer dissolved in organic solvents and the electrically conducting particles, and the second layer being in contact with the at least a portion of the at least one surface of said substrate or object.

21. The reflecting device of claim 20 wherein other electrically conducting particles are dispersed in the another polymer.

22. A method for making shielding or reflective material, the method comprising: forming a polymer-organic solvent solution by dissolving a polymer in an organic solvent; embedding electrically conducting particles in the polymer-organic solvent solution in a substantially random distribution by dispersing the electrically conducting particles in the polymer-organic solvent solution; a percent weight of the electrically conducting particles dispersed in the polymer-organic solvent solution exceeding a predetermined percent weight; each characteristic dimension of each one of the electrically conducting particles being larger than a predetermined dimensional quantity.

23. The method of claim 22 wherein the polymer-organic solvent solution is a DNA or RNA-CTMA-organic solvent solution.

24. A method of forming an electromagnetically shielded device, the method comprising forming a film of the shielding or reflective material, formed by the method of claim 22, on at least of a portion of at least one surface of an object to be shielded by at least one of casting, spin depositing, spray coating, inkjet printing, vapor deposition, molecular vapor deposition or embossing; and drying the film of said shielding or reflective material.

25. The method of claim 24 wherein drying occurs a temperature between about 60° F. to about 80° F.

26. The method of claim 24 further comprising depositing, before forming the film of the shielding or reflective material, a layer of insulating material on at least a portion of the at least one surface of the object to be shielded.

27. A method of forming an electromagnetically reflective device, the method comprising: selecting a thickness of a film of the shielding or reflective material, formed by the method of claim 22, such that, when electromagnetic radiation is incident on one surface of the film along one direction, electromagnetic radiation from the film has one component in an opposite direction of electromagnetic radiation incident on the one surface of the film; forming the film on at least a portion of a surface of a substrate by at least one of casting, spin depositing, spray coating, inkjet printing, vapor deposition, molecular vapor deposition or embossing; and drying the film of the shielding or reflective material.

28. The method of claim 27 wherein drying occurs a temperature between about 60° F. to about 80° F.

29. The method of claim 27 wherein the substrate is substantially flexible.

* * * * *